(12) United States Patent
Sreenivasan et al.

(10) Patent No.: US 7,795,132 B2
(45) Date of Patent: Sep. 14, 2010

(54) SELF-ALIGNED CROSS-POINT MEMORY FABRICATION

(75) Inventors: Sidlgata V. Sreenivasan, Austin, TX (US); Christopher Mark Melliar-Smith, Austin, TX (US); Dwayne L. LaBrake, Cedar Park, TX (US)

(73) Assignee: Molecular Imprints, Inc., Austin, TX (US)

( * ) Notice: Subject to any disclaimer, the term of this patent is extended or adjusted under 35 U.S.C. 154(b) by 0 days.

(21) Appl. No.: 12/182,905

(22) Filed: Jul. 30, 2008

(65) Prior Publication Data

US 2009/0035934 A1 Feb. 5, 2009

Related U.S. Application Data

(60) Provisional application No. 60/952,996, filed on Jul. 31, 2007, provisional application No. 61/017,242, filed on Dec. 28, 2007.

(51) Int. Cl.
*H01L 21/4763* (2006.01)

(52) U.S. Cl. .................. 438/622; 216/40; 216/41; 438/99; 438/462

(58) Field of Classification Search .................. None
See application file for complete search history.

(56) References Cited

U.S. PATENT DOCUMENTS

| 6,932,934 | B2* | 8/2005 | Choi et al. ............... 264/496 |
|---|---|---|---|
| 6,936,194 | B2* | 8/2005 | Watts ...................... 264/1.25 |
| 7,179,396 | B2 | 2/2007 | Sreenivasan |
| 7,261,831 | B2 | 8/2007 | Sreenivasan |
| 7,323,417 | B2 | 1/2008 | Sreenivasan |
| 7,038,231 | B2 | 7/2008 | Hart et al. |
| 2004/0065252 | A1* | 4/2004 | Sreenivasan et al. ......... 117/84 |
| 2004/0065976 | A1* | 4/2004 | Sreenivasan et al. ..... 264/171.1 |
| 2004/0124566 | A1* | 7/2004 | Sreenivasan et al. ........ 264/494 |
| 2004/0188381 | A1* | 9/2004 | Sreenivasan ................ 216/40 |
| 2004/0211754 | A1* | 10/2004 | Sreenivasan ................ 216/41 |
| 2006/0128129 | A1* | 6/2006 | Stasiak et al. ............... 438/584 |
| 2007/0082461 | A1* | 4/2007 | Sreenivasan ............... 438/455 |
| 2007/0099337 | A1* | 5/2007 | Sreenivasan ................ 438/99 |
| 2008/0118872 | A1 | 5/2008 | Sreenivasan |

OTHER PUBLICATIONS

PCT/US2008/09238 International Search Report, Nov. 5, 2008.

* cited by examiner

*Primary Examiner*—Michael S. Lebentritt
*Assistant Examiner*—Shantanu C Pathak
(74) *Attorney, Agent, or Firm*—Laura C. Robinson

(57) ABSTRACT

Fabricating a cross-point memory structure using two lithography steps with a top conductor and connector or memory element and a bottom conductor orthogonal to the top connector. A first lithography step followed by a series of depositions and etching steps patterns a first channel having a bottom conductor. A second lithography step followed by a series of depositions and etching steps patterns a second channel orthogonal to the first channel and having a memory element connecting the an upper conductor and the lower conductor at their overlaid intersections.

7 Claims, 30 Drawing Sheets

SELF-ALIGNED CROSS-POINT MEMORY FABRICATION

CROSS-REFERENCE TO RELATED APPLICATIONS

This application claims the benefit of priority to U.S. Provisional Application No. 60/952,996, filed on Jul. 31, 2007 and U.S. Provisional Application No. 61/017,242, filed on Dec. 28, 2007. The entire contents of both applications are incorporated herein by references in their entirety.

TECHNICAL FIELD

The field of the invention relates generally to semiconductor fabrication. More particularly, the present invention is directed to fabricating a cross-point memory array.

BACKGROUND INFORMATION

Nano-fabrication involves the fabrication of very small structures, e.g., having features on the order of nanometers or smaller. One area in which nano-fabrication has had a sizeable impact is in the processing of integrated circuits. As the semiconductor processing industry continues to strive for larger production yields while increasing the circuits per unit area formed on a substrate, nano-fabrication becomes increasingly important. Nano-fabrication provides greater process control while allowing increased reduction of the minimum feature dimension of the structures formed. Other areas of development in which nano-fabrication has been employed include biotechnology, optical technology, mechanical systems and the like.

An exemplary nano-fabrication technique is commonly referred to as imprint lithography. Exemplary imprint lithography processes are described in detail in numerous publications, such as United States patent application publications 2004/0065976 and 2004/0065252 and U.S. Pat. No. 6,936,194, all of which are incorporated by reference herein.

The imprint lithography technique disclosed in each of the aforementioned United States patent application publications and United States patent includes formation of a relief pattern in a polymerizable layer and transferring a pattern corresponding to the relief pattern into an underlying substrate. The substrate may be positioned upon a stage to obtain a desired position to facilitate patterning thereof. A mold is employed spaced-apart from the substrate with a formable liquid present between the mold and the substrate. The liquid is solidified to form a patterned layer that has a pattern recorded therein that is conforming to a shape of the surface of the mold in contact with the liquid. The mold is then separated from the patterned layer such that the mold and the substrate are spaced-apart. The substrate and the patterned layer are then subjected to processes to transfer, into the substrate, a relief image that corresponds to the pattern in the patterned layer.

DETAILED DESCRIPTION

Cross-point memory structures may be manufactured with three lithography steps including an intermediate lithography step to form pillars (connectors) that connect the two conductors. Two of these lithography steps (connectors and the second conductor) require sub-resolution overlay. There is also a desire for cross-point memory devices that utilize self-assembly molecular switching elements. The present invention discloses fabricating cross-point devices wherein the three materials (the first and second conductors and the connecting material) are deposited and aligned using standard silicon processing techniques.

In the present invention, an integration scheme where only two lithography steps are sufficient to create the cross-point structures is described. To that end, the precise (sub-resolution) overlay requirement may be absent and the cross-point is naturally formed at the intersection of the two conductor levels.

Figure 61:
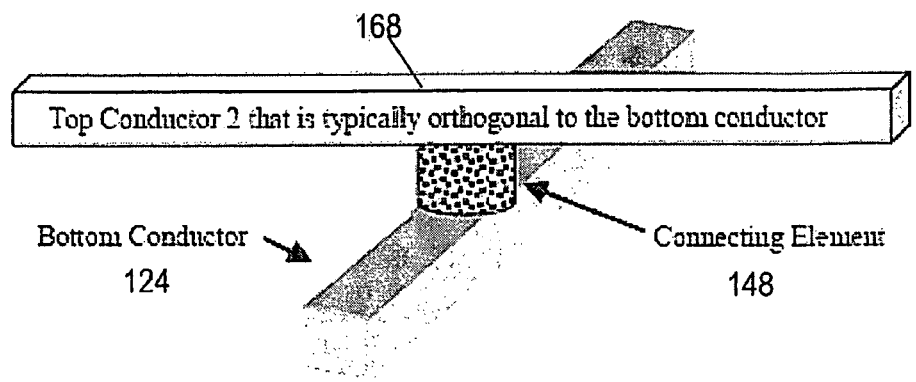
FIGS. 61-62 are views of a cross-point memory structure that may be fabricated by embodiments herein.
Figure 62:
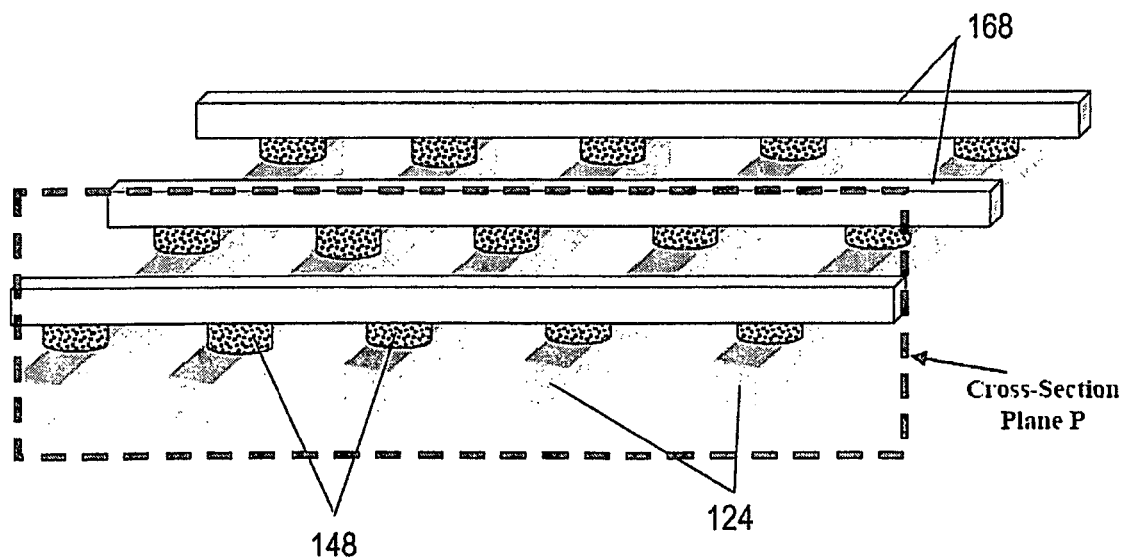

Referring to FIGS. 61 and 62, the present invention is focused on making cross-point structures using 2 levels of lithography and a self-aligned process wherein the connector material 148 forming a memory element between the two conductor levels 168 and 124 is formed at the intersection of the two conductors that are typically laid orthogonal to each other. For an embodiments herein, the lower conductors 124 and the connectors 148 may be made out materials that may be etched using a dry etch (reactive ion etch (RIE) process and hence may be removed in a subtractive manner. In one embodiment, they are made out of silicon. In an exemplary structure, the lower conductors 124 are aluminum, titanium or other metal conductors and the connectors 148 are polysilicon. The connectors 148 may also be other materials that act as a reversible switches such as phase change materials, e.g., GST materials as described in Yang et al., "Patterning of $Ge_2Sb_2Te_5$ phase change material using UV nano-imprint lithography," Microelectronic Engineering, Volume 84, Issue 1, January 2007, pages 21-24, which is incorporated herein by reference. The bottom conductor 124 may also be formed by highly doped silicon instead of being a metal. The top conductor 168 may be formed from a variety of etchable metals including, but not limited to, aluminum and copper.

Figure 1:
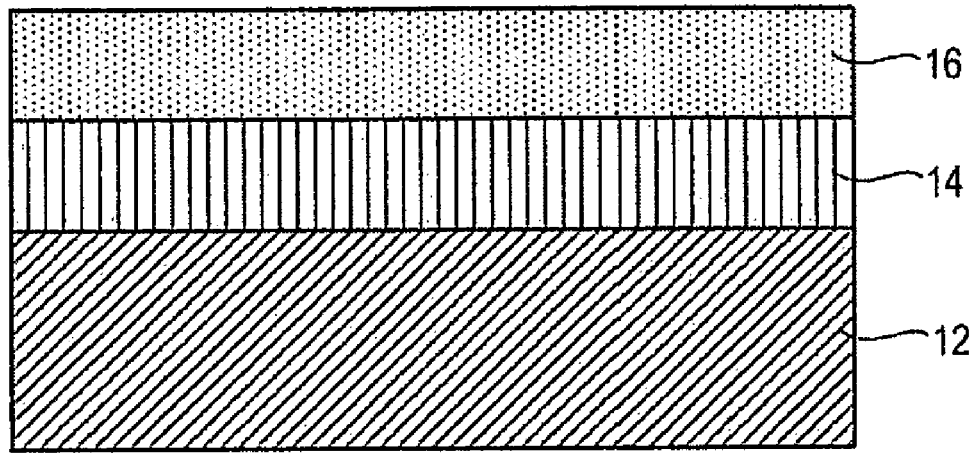
FIG. 1 is a section view of stacked material layers in one embodiment.

FIG. 1 is a section view of a multi-layered structure 10 suitable for fabricating a cross-point memory structure. Multi-layered structure 10 comprises a substrate 12, a first conducting layer 14, and a connector or switching material stack layer 16. Substrate 12 may be formed from materials including, but not limited to, silicon, gallium arsenide, quartz, fused-silica, sapphire, organic polymers, siloxane polymers, borosilicate glass, fluorocarbon polymers, or a combination thereof First conducting layer 14 may be formed from tungsten. Switching material layer 16 may be formed from a combination of materials including, but not limited to, polysilicion, chalcogenite, GST, and or material structures configured as diodes (e.g., PN junctions).

Figure 2:
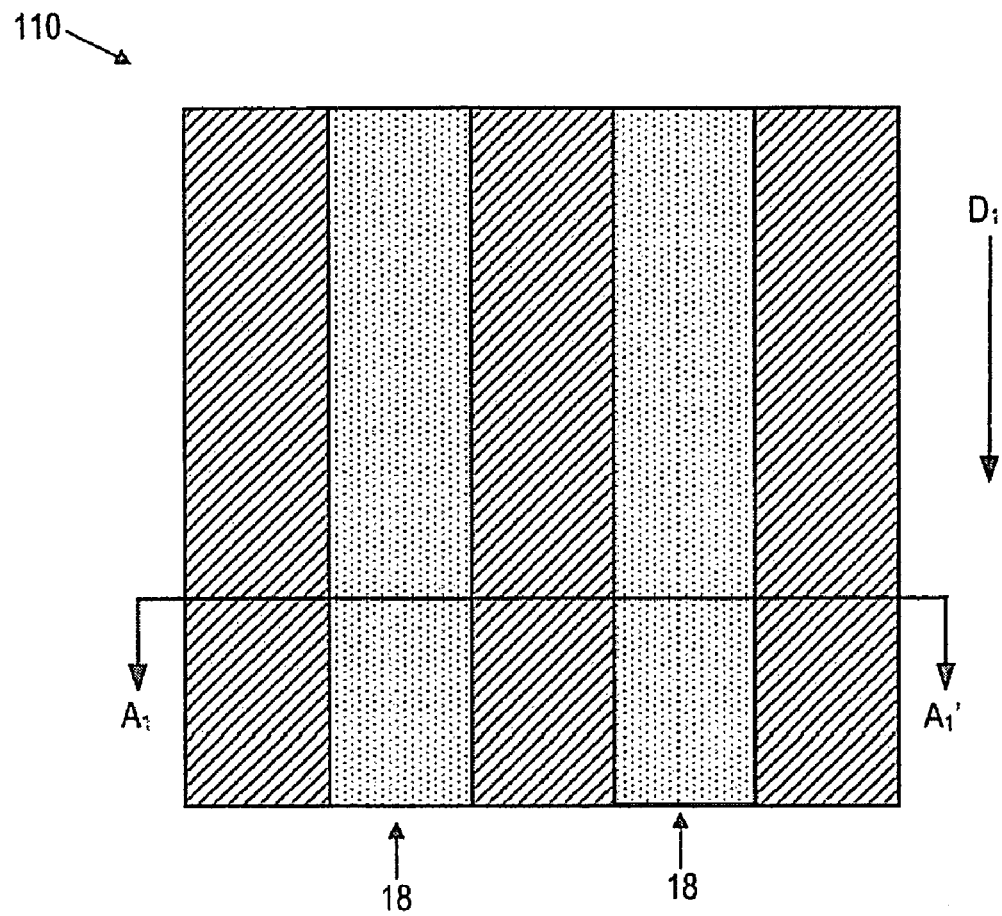
FIGS. 2-3 are section views after patterning and etching the layers of FIG. 1.
Figure 3:
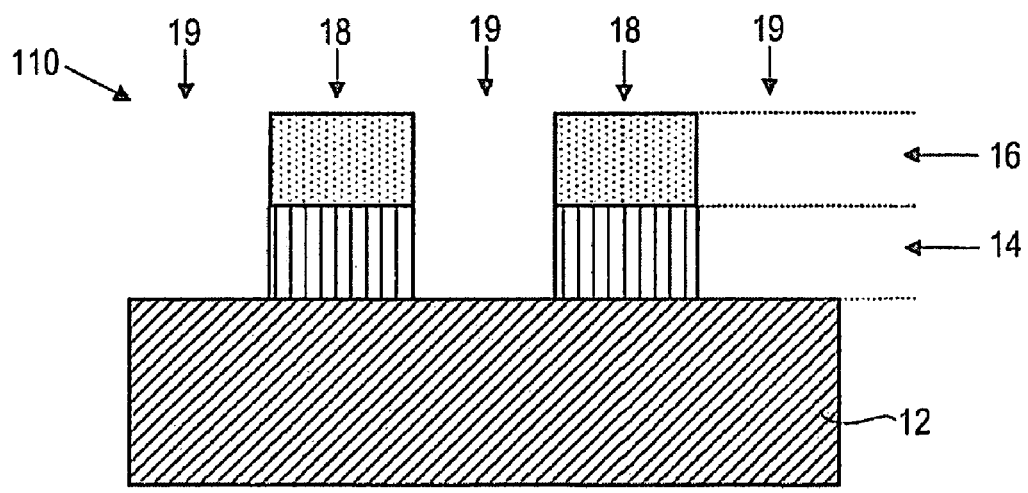

FIGS. 2 and 3 illustrate top and section views of multi-layered structure 10. Multi-layered structure 10 has a pattern formed by etching away channels of first conducting layer 14 and connector or switching layer 16 thereby defining multi-layered structure 110. FIG. 3 is a section view of structure 110 taken along section line $A_1$-$A_1'$. In this view, the pattern is shown as a series of parallel channels 19 formed by etching first conducting layer 14 and switching material stack layer 16 along the direction $D_1$ thereby defining gratings 18. The pattern may be formed in multi-layered structure 110 using a lithography step followed by an etching step that stops on substrate 12. For the lithography step, any known technique, e.g., photolithography (various wavelengths including G line, I line, 248 nm, 193 nm, 157 nm, and 13.2-13.4 nm), contact lithography, e-beam lithography, x-ray lithography, ion-beam lithography, atomic beam lithography, and imprint lithography may be employed. Imprint lithography is described in U.S. Pat. No. 6,932,934, United States patent application publication 2004/0124566, United States patent application publication 2004/0188381, and United States patent application publication 2004/0211754, all of which are incorporated by reference herein.

The etching step in FIGS. 2 and 3 employed to etch conducting layer 14 may use a process described in Oehrlein et al., "Surface Modifications of Electronic Materials induced by Plasma Etching," J. Electrochem. Soc. 136, 2050 (1989); Saia et al., "Plasma Etching Methods for the Formation of Planarized Tungsten Plugs used in Multilevel VLSI Metallizations," in Proc. 6$^{th}$ Symp. Plasma Processing, The Electrochemical Society, ECS Proc. Vol. 87-6, 173 (1987); Balooch et al., "The Kinetics of Tungsten and Tungsten Silicide Films by Chlorine Atoms," J. Electrochem. Soc. 135, 2016 (1988); and van Roosmalen, "Dry Etching for VLSI," Springer, pp. 121-125 (1991); all of which are incorporated herein by reference.

The etching step in FIGS. 2 and 3 employed to etch connector layer 16 may use a process described in van Arendonk et al., European Patent 337,562 entitled "Method of Manufacturing a Semiconductor Device," and van Roosmalen, "Dry Etching for VLSI," Springer, pp. 113 (1991); all of which are incorporated herein by reference.

Figure 4:
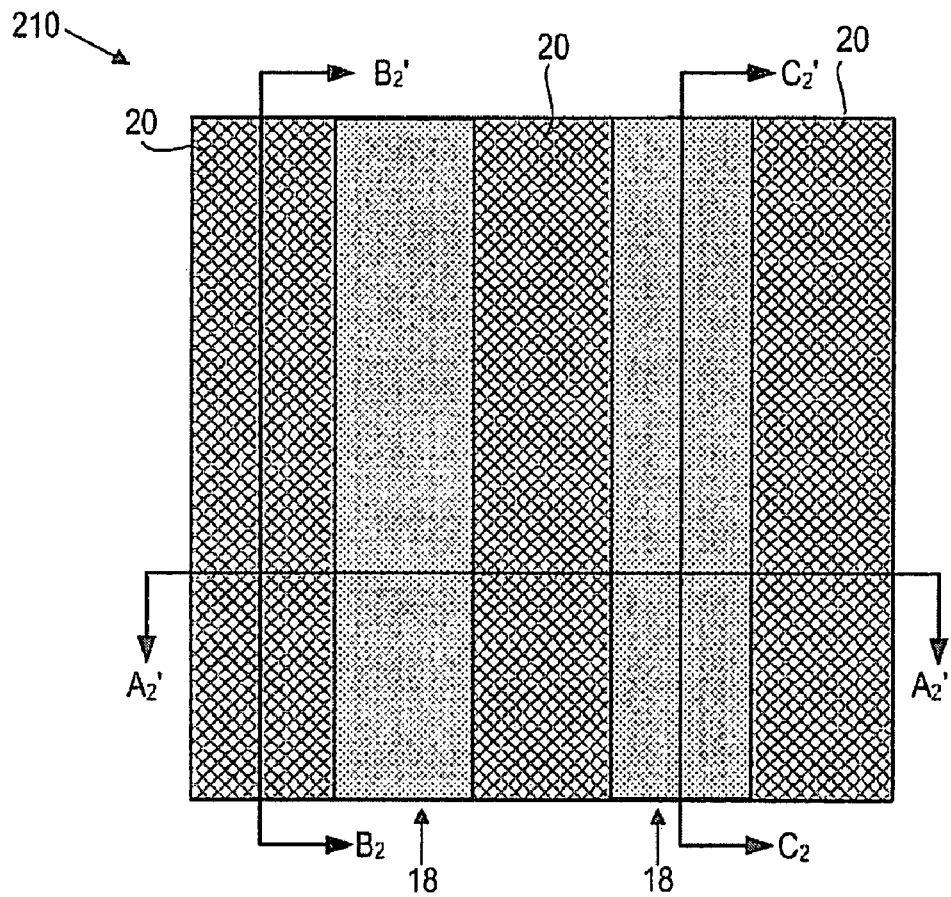
FIGS. 4-7 are section views of the structure of FIG. 2 after deposition of a dielectric layer.
Figure 5:
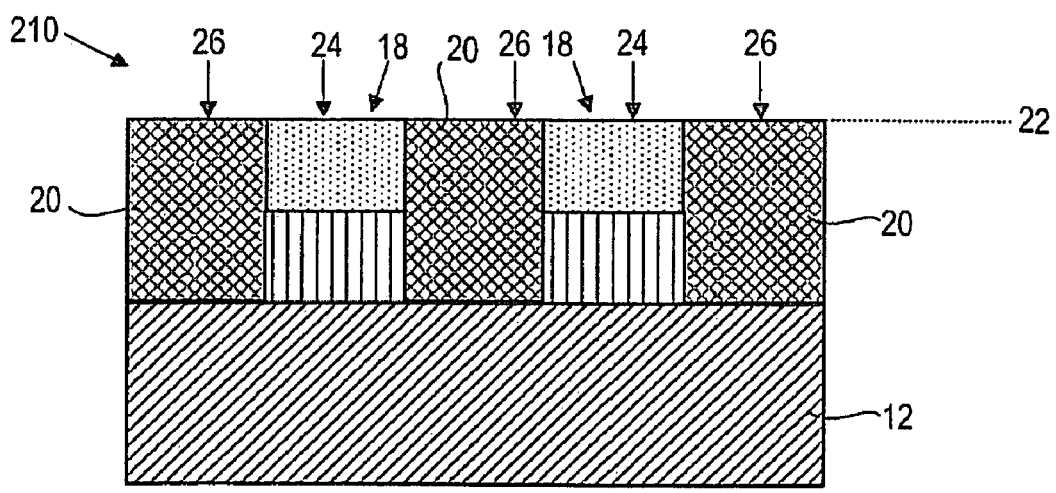
Figure 6:
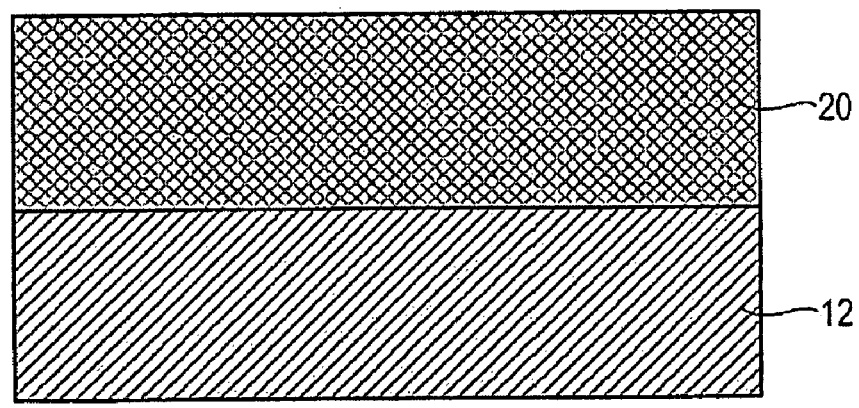
Figure 7:
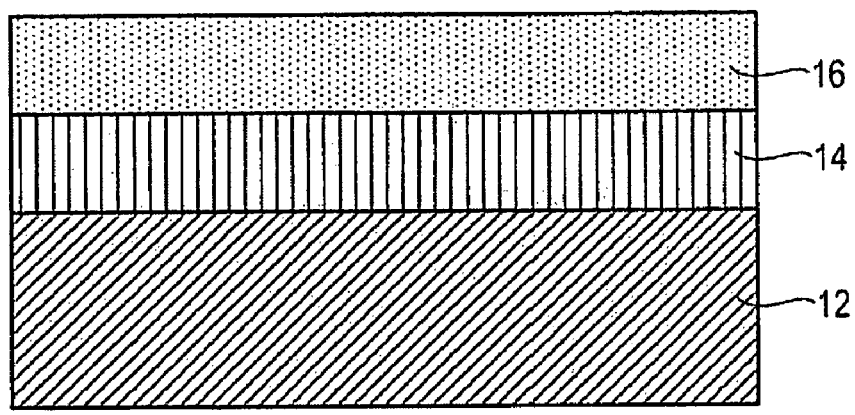

FIGS. 4-7 illustrate top and section views of multi-layered structure 110 after deposition of a dielectric material 20 defining a multi-layered structure 210. FIG. 4 is a top view showing the channels 19 filled with dielectric material 20 and the various section lines. FIG. 5 is the section view taken along section line $A_2$-$A_2'$ orthogonal to gratings 18. In this view, the channels 19 are filled with dielectric material 20 to the surface 24 of gratings 18. FIG. 6 is the section view taken along line section line $B_2$-$B_2'$ where only substrate 12 and dielectric 20 are visible. FIG. 7 is the section view taken along section line $C_2$-$C_2'$. In this view, the lower or first conductor 14, substrate 12 and connector material 16 are visible. Dielectric material 20 may be deposited on multi-layered structure 210 by methods including, but not limited to, chemical vapor deposition (CVD), physical vapor deposition (PVD), sputter deposition, spin-coating, and dispensing of a liquid. Dielectric material 20 may comprise silicon oxide or any low-k dielectric material. Dielectric material 20 may be subjected to a chemo-mechanical polish (CMP) process that results in multi-layered structure 210 having crown surface 22. Crown surface 22 is defined by an exposed surface 24 of each of gratings 18 and upper surfaces 27 of dielectric material 20. Portions of dielectric material 20 may be removed to form crown surface 22 using etching process as described in Coburn et al. "Some Chemical Aspects of the Fluorocarbon Plasma Etching of Silicon and its Compounds," IBM J. Res. Develop. 23, 33 (1979); Coburn et al., "Some chemical Aspects of the Fluorocarbon Plasma Etching of Silicon and it's Compounds," Solid State Technol. 22(4), 117, (1979); and van Roosmalen, "Dry Etching for VLSI," Springer, p. 107 (1991); all of which are incorporated herein by reference.

Figure 8:
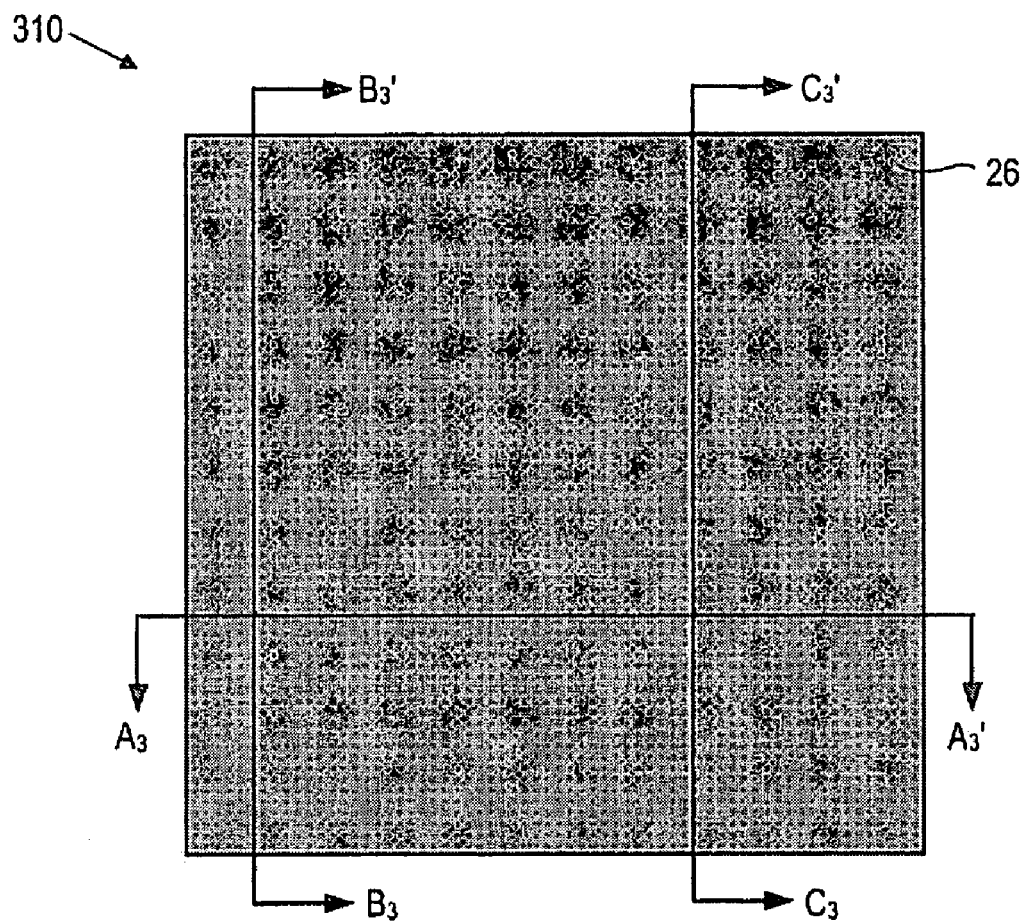
FIGS. 8-11 are top and section views of a multi-layered structure according to one embodiment.
Figure 9:
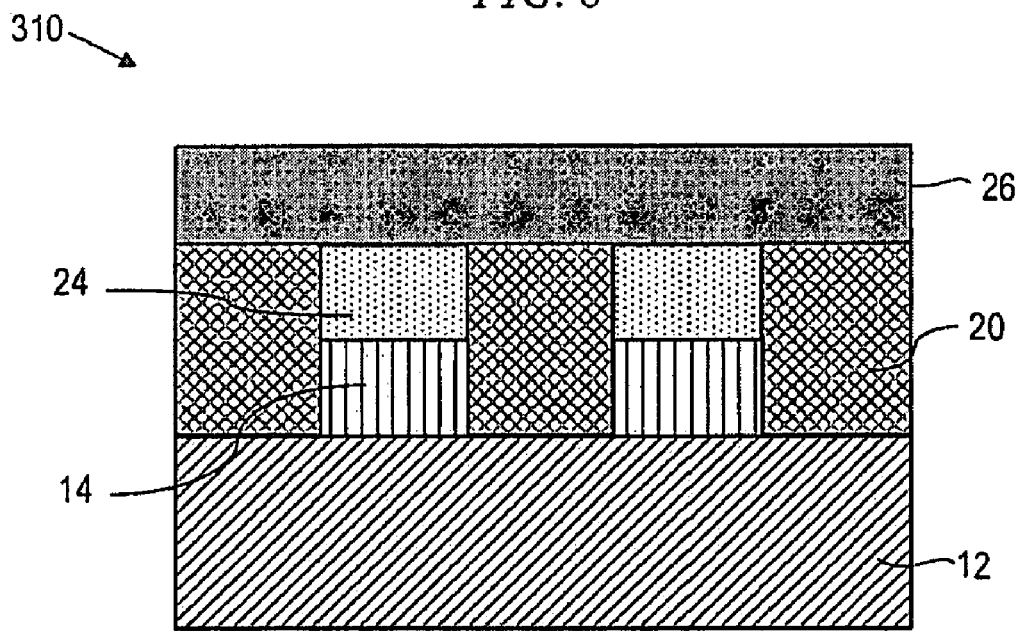
Figure 10:
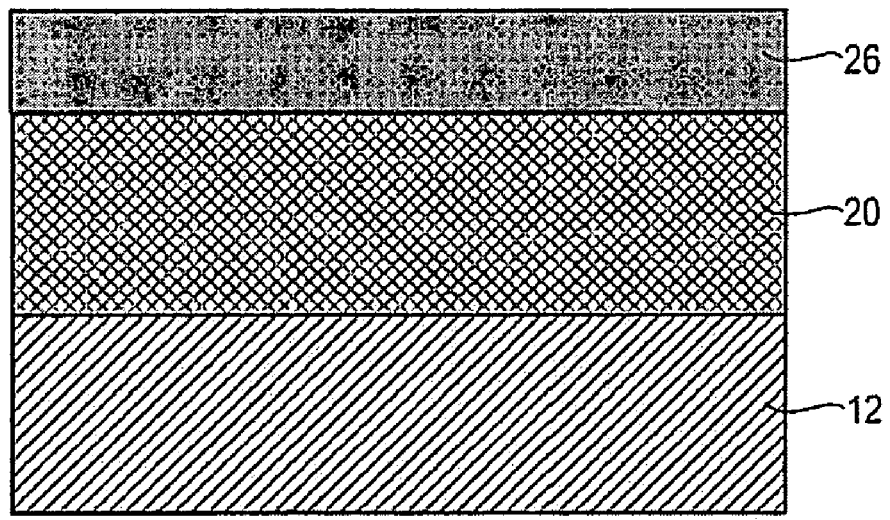
Figure 11:
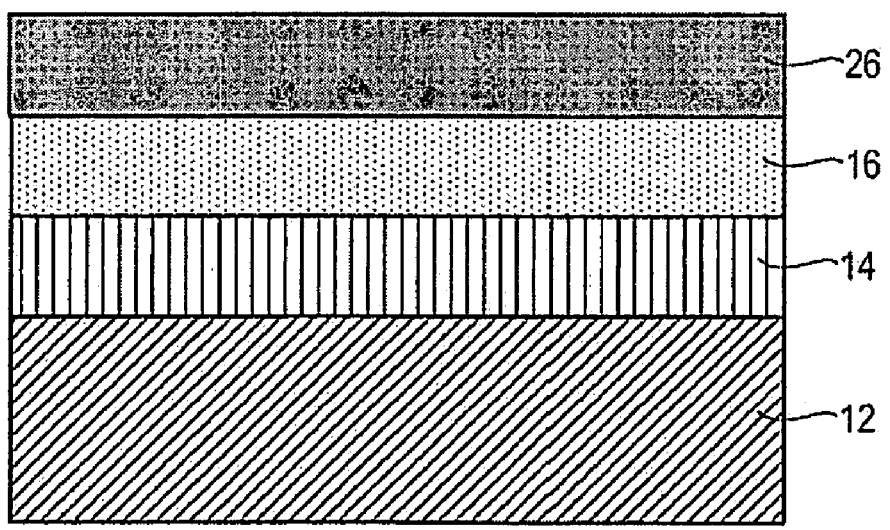

FIGS. 8-11 are top and section views of multi-layered structure 210 after a second or upper conducting layer 26 has been deposited over crown surface 22 thereby defining multi-layered structure 310. FIG. 8 is the top view showing only conducting layer 26 and illustrating various section lines. FIG. 9 is the section view taken along section line $A_3$-$A_3'$ showing the material layers of FIG. 5 along with the layer of conducting material 26. FIG. 10 is the section view taken along section line $B_3$-$B_3'$ through the dielectric layer. In this view, only conducting layer 26, dielectric layer 20 and substrate 12 are visible. FIG. 11 is the section view taken along section line $C_3$-$C_3'$ through the channel 18 which has the various material layers. In this view, the second or upper conductor 26, the connector or switching layer 16, the lower conductor 14 and the substrate are visible. Second conducting layer 26 may be formed from various conducting materials (e.g., tungsten). Second conducting layer 26, depending on composition, may be deposited on multi-layered structure 210 by processes including, but not limited to, chemical vapor deposition (CVD), physical vapor deposition (PVD), sputter deposition, spin-coating, and dispensing of a liquid.

Figure 12:
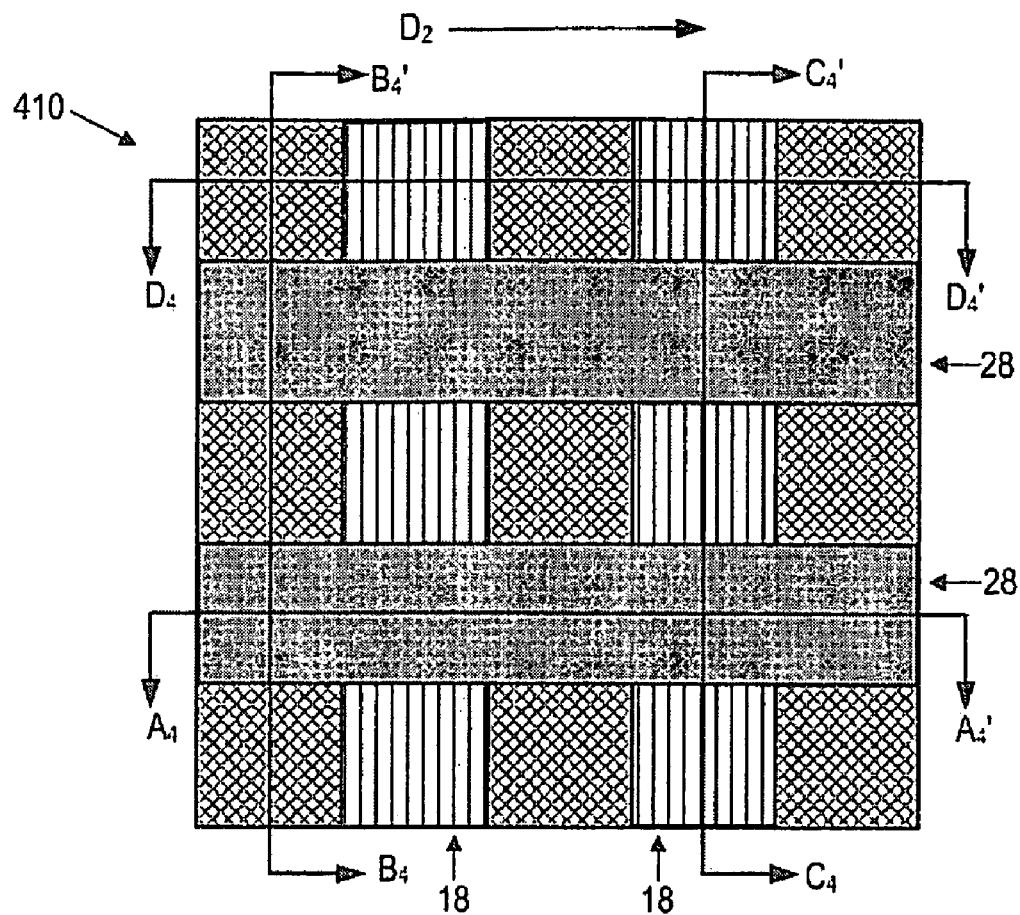
FIGS. 12-16 are top and section views of a multi-layered structure according to one embodiment.
Figure 13:
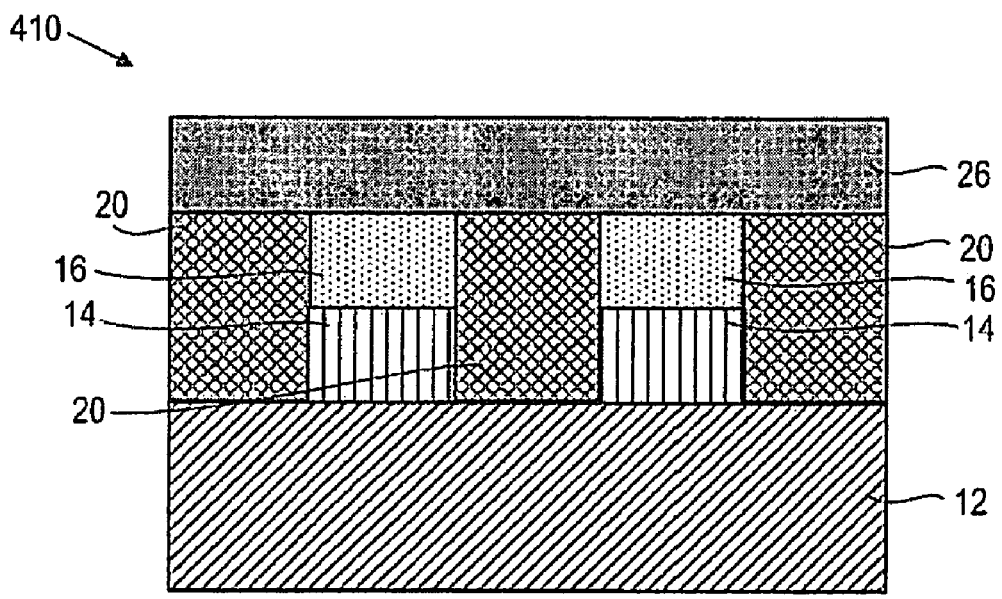
Figure 14:
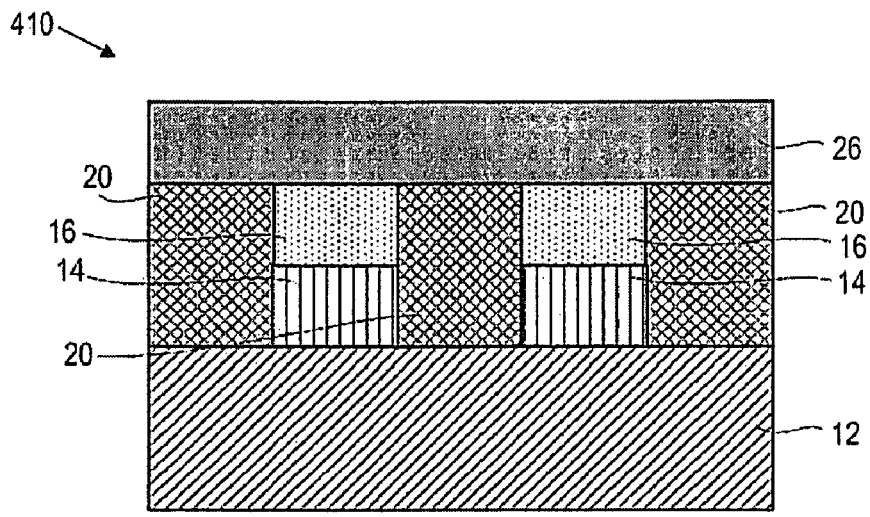
Figure 15:
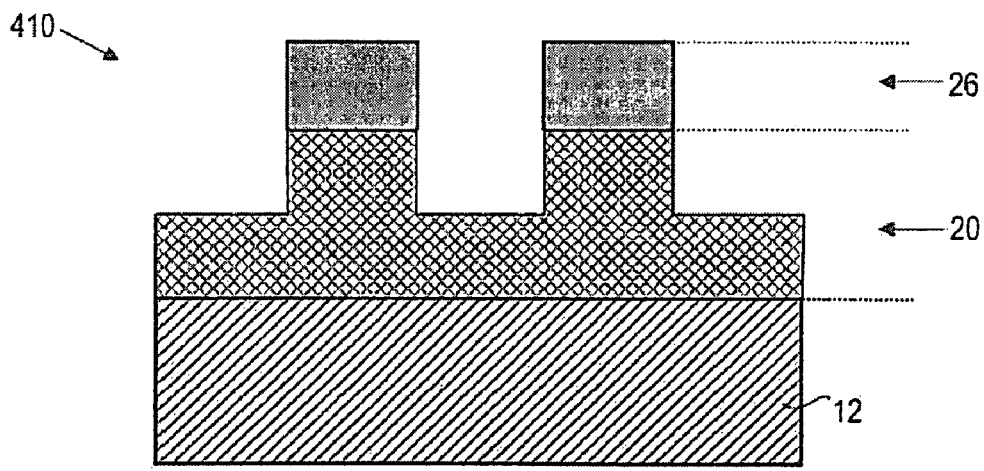
Figure 16:
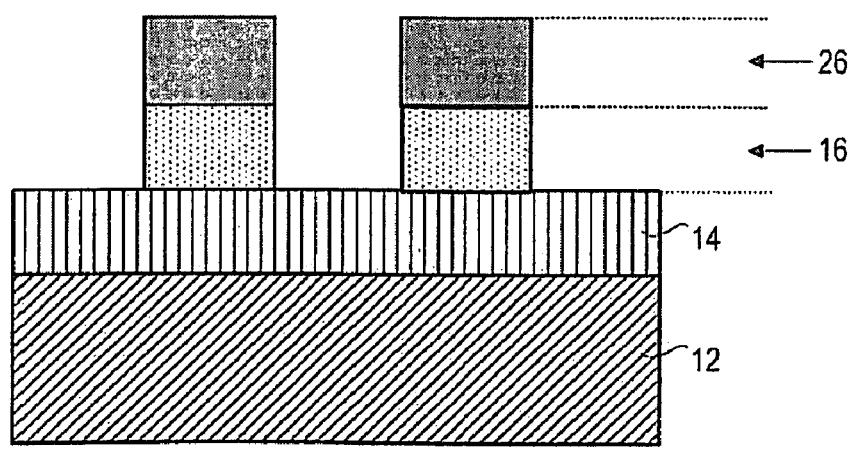
Figure 17:
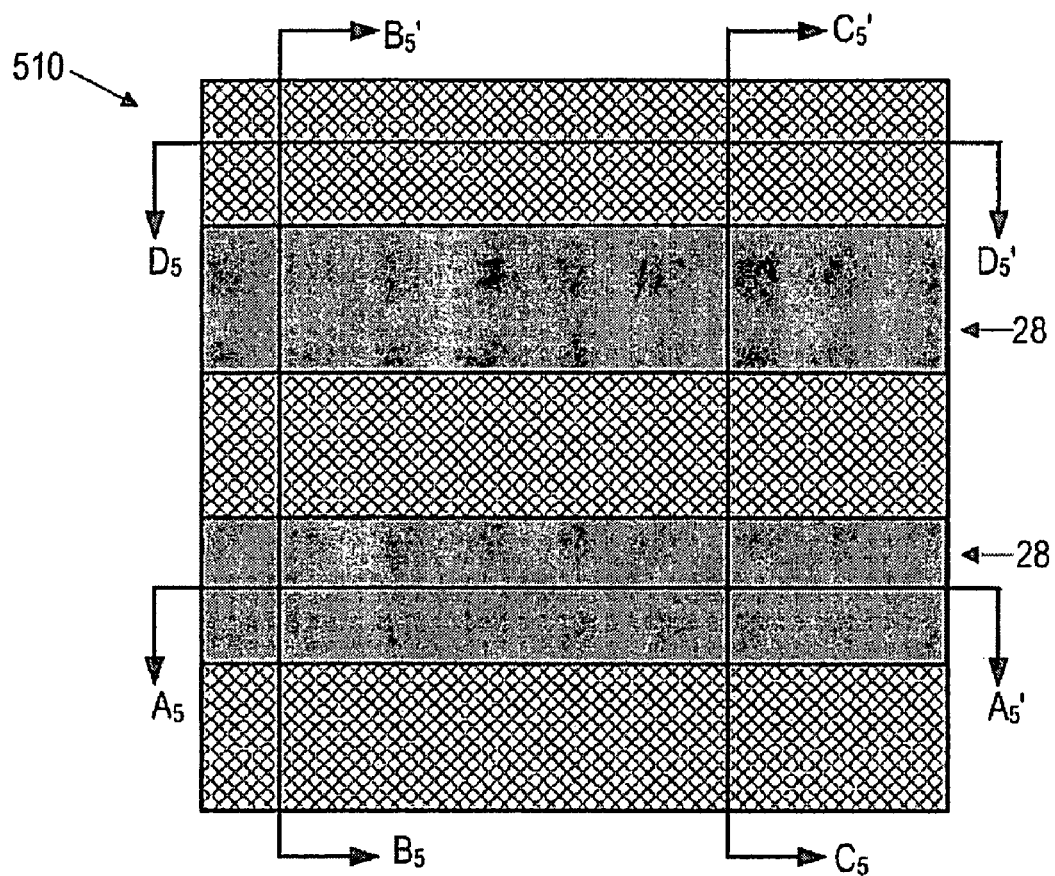
FIGS. 17-21 illustrate the top view of a multi-layered structure according to one embodiment.

FIGS. 12-16 are top and section views of multi-layered structure 310 after removing portions of upper conductor 26 having a pattern of strips 28 orthogonal to channels 18 thereby defining multi-layered structure 410. The removed material define open channels 29. FIG. 12 is a top view of structure 310 showing various section lines, strips 28 of upper conductor 26, and the exposed sections of lower conductor 14 and dielectric 20. FIG. 13 is the section view taken along section line $A_4$-$A_4'$ through one of the conducting strips 28. In this view, substrate 12, dielectric strips 20 and the channels 18 filled with connector 16 and lower conductor 14 are visible. FIG. 14 is the section view taken along section line $D_4$-$D_4'$ through exposed portions of channel 18 and dielectric strips 20. Because of the back drop of upper conductor strip 28, this view shows the same layers as FIG. 13. FIG. 15 is the section view taken along section line $B_4$-$B_4'$ through the dielectric strip 20. In this view, substrate 12, strips 28 of conducting material 26, and portions of dielectric material 20 are shown. FIG. 16 is the section view taken along section line $C_4$-$C_4'$ through lower conducting channel 18. In this view, the material stack of upper conductor 26, connector 16, lower conductor 14 that orthogonally intersect to form a memory element are visible. The pattern formed in second conducting layer 26 and switching or connector material stack layer 16 defines the strips or gratings 28. Gratings 28 extend along a second direction $D_2$ orthogonal to the first direction $D_1$ shown in FIG. 2. The pattern formed in multi-layered structure 410 may use a lithography step followed by etching steps which stop at first conducting layer 16. The lithography step and the etching steps may be selected from the processes mentioned above with respect to FIGS. 1-11. The section view taken along section line $A_4$-$A_4$' of multi-layered structure 410 shows the orthogonal overlapping of first and second conducting layers 14 and 26 are connected via switching or connector material stack layer 16 to form a memory element.

Figure 18:
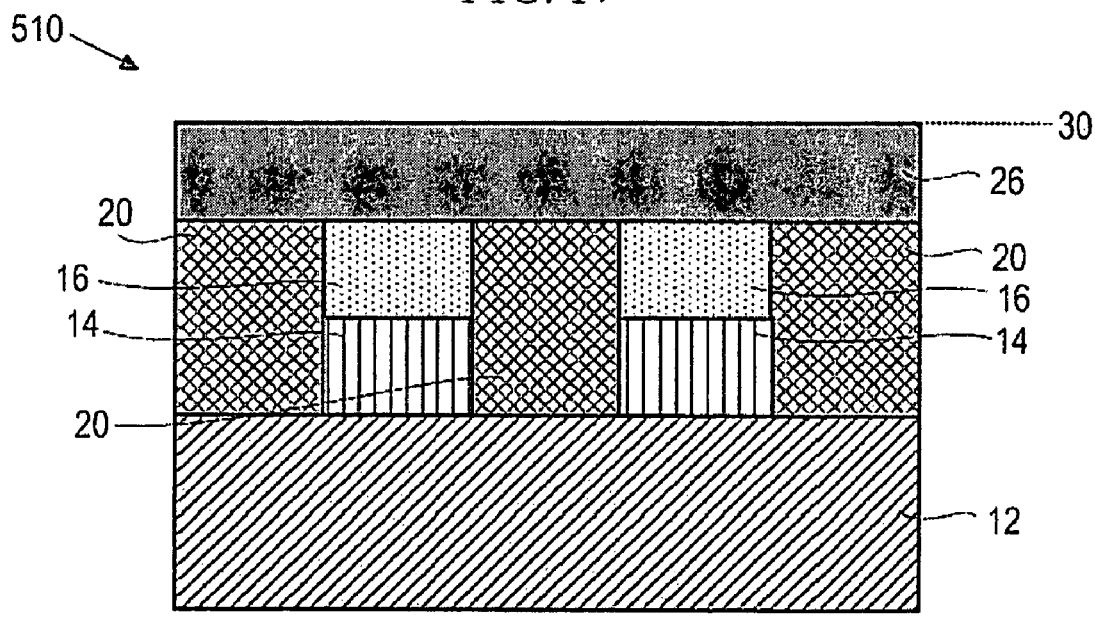
Figure 19:
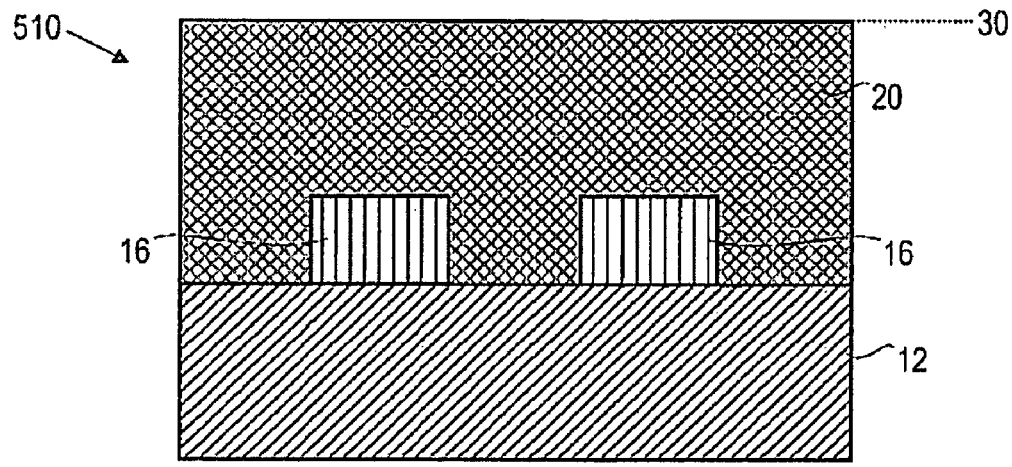
Figure 20:
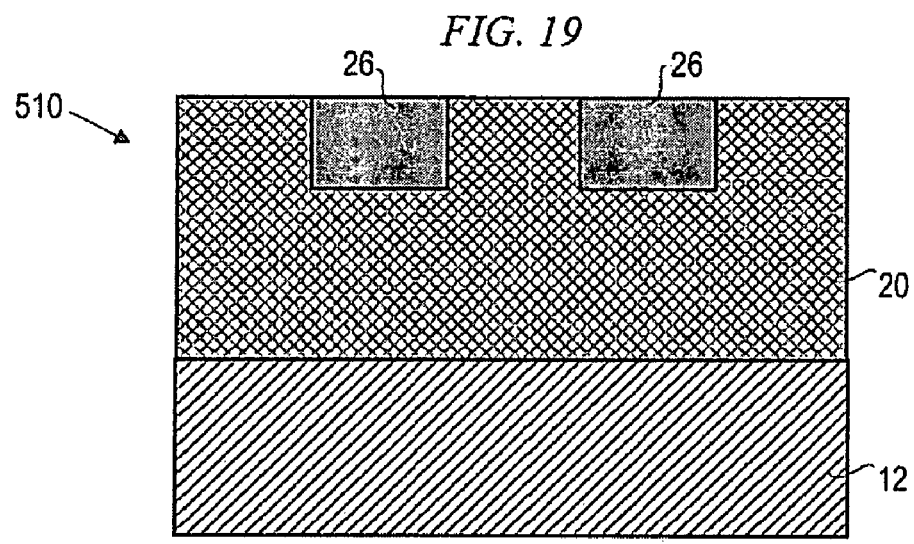
Figure 21:
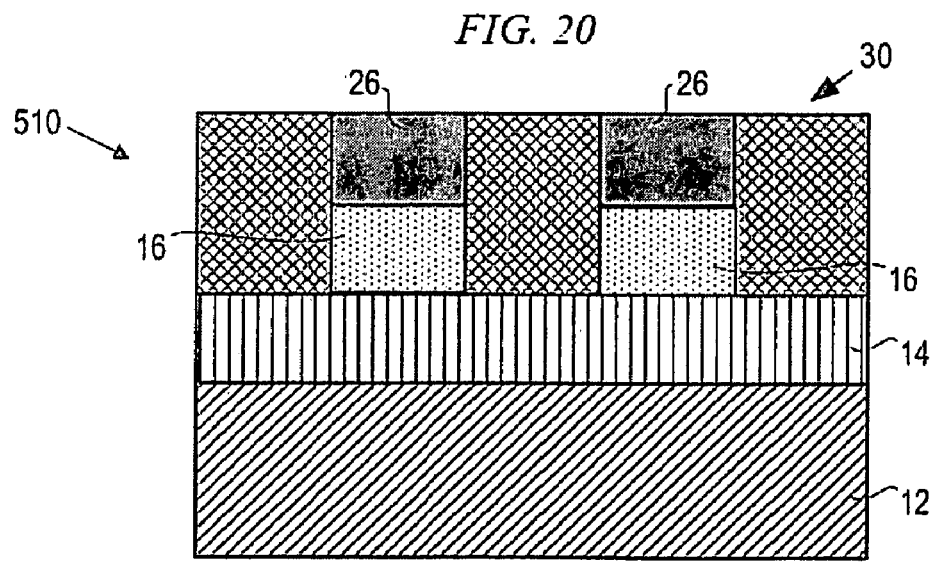

FIGS. 17-21 illustrate top and section views of multi-layered structure 410 after deposition of dielectric material 20 to fill the open channels 29 thereby defining multi-layered structure 510. FIG. 18 is the section view taken along section line $A_5$-$A_5$'. Since the open channel 29 is not visible in this view, the filling of channel 29 with dielectric material 20 does not reveal differences from the view in FIG. 13. FIG. 19 is the section view taken along line $D_5$-$D_5$' through the dielectric 20 fill of channel 29. In this view, only dielectric 20, lower conductor 14 and substrate 20 are visible. FIG. 20 is the section view taken along section line $B_5$-$B_5$' through the dielectric layer. The dielectric layer 20 blocks everything except sections of upper conductor 26 and substrate 12. FIG. 21 is the section view taken along section line $C_5$-$C_5$' through channel 18 and lower conductor 14. In this view, the orthogonal overlapping of first and second conducting layers 14 and 26 are connected via switching material stack layer 16 to form a memory element is visible wherein the open channels 29 are filled to the top of upper conductor 26 with dielectric material 20. Multi-layered structure 510 shows a top surface 30 having lines of second conducting layer 26 separated by dielectric material 20. FIG. 21 shows the upper conductors exposed at the surface. In many applications, it may be necessary to cover the surface with a dielectric layer before further processing.

Figure 22A:
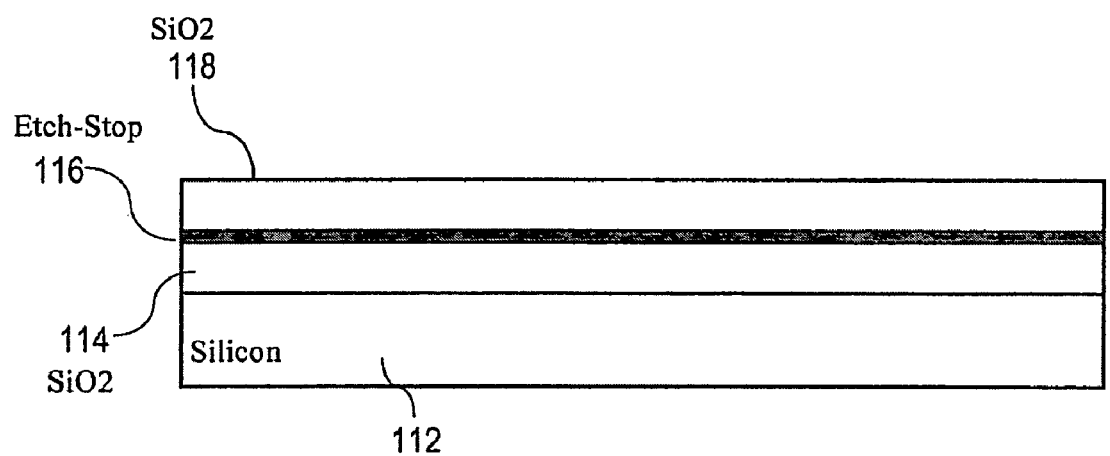
FIG. 22A illustrates a multilayer structure according to another embodiment.

Another embodiment for fabricating a cross-point memory structure in a self-aligned process with two lithography steps is described relative to FIGS. 22A-60. FIG. 22A illustrates a multilayer structure including a substrate 112 (e.g., Si), a first dielectric layer 114 (e.g., $SiO_2$ or low k material), an etch stop layer 116 (e.g., SiN, SiC, or Si(O)N), and a second dielectric layer 118 (e.g., $SiO_2$).

Figure 22B:
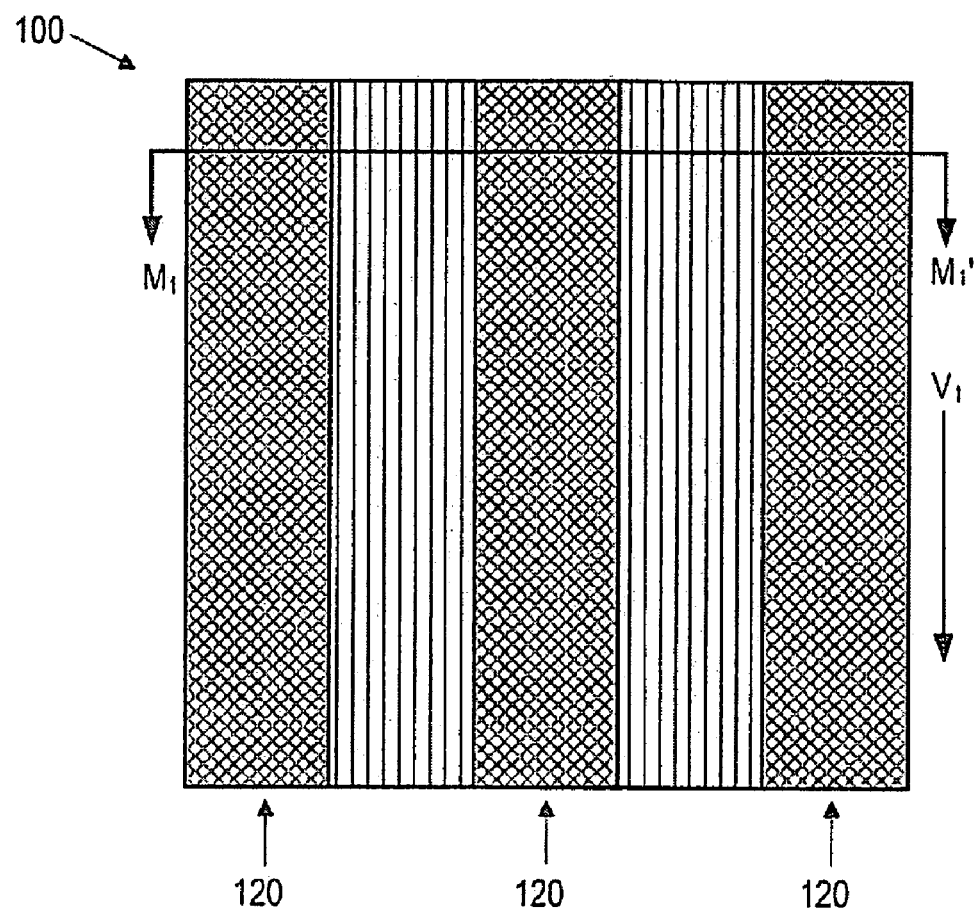
FIG. 22B is a top view of the multilayer structure of the embodiment of FIG. 22A.
Figure 23:
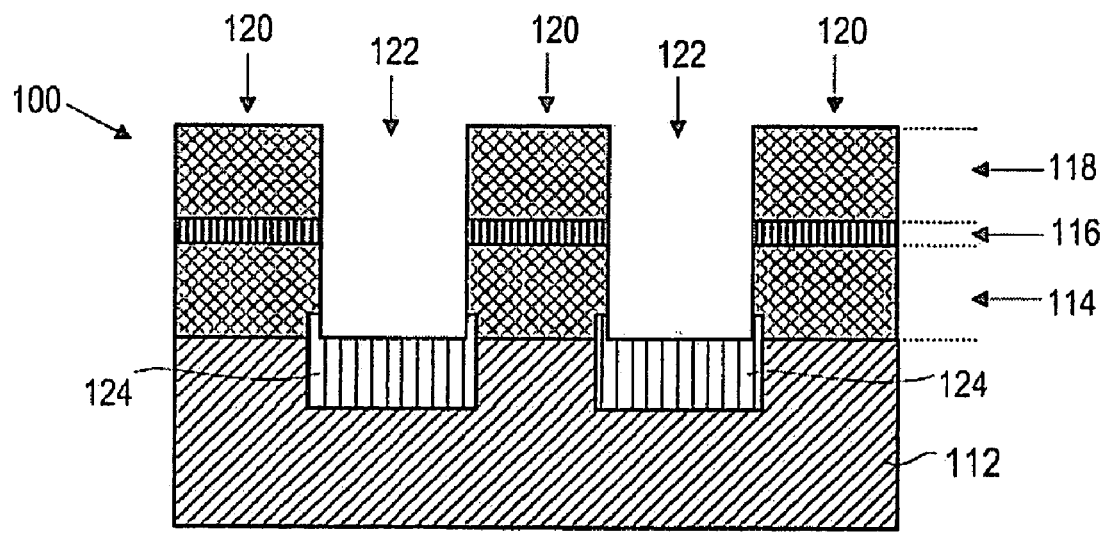
FIG. 23 is a section view of the multilayer structure shown in FIG. 22B taken along section line $M_1$-$M_1'$.

FIG. 22B is a top view of the multilayer structure 100. FIG. 23 is a section view taken along section line $M_1$-$M_1$' as shown in FIG. 22B with the etched channels 122. Substrate 112 may be formed from substantially the same materials as mentioned above with respect to substrate 12 and FIG. 1. By appropriate masking and multiple etching steps, channels may be etched through the layers atop substrate 112.

Multi-layered structure 100 is shown after having a pattern formed using the first lithography step. The patterns are etched through first dielectric layer 114, etch stop layer 116, and second dielectric layer 118 and define gratings 120 and trenches 122 along a first direction $V_1$ shown in FIG. 22B. The pattern may be formed in multi-layered structure 100 using the first lithography step to define the trenches 122 followed by etching steps selected to stop on substrate 112. The lithography step and the etching steps may be selected for any of the processes disclosed above with respect to the embodiment described relative to FIGS. 1-11.

Figure 24:
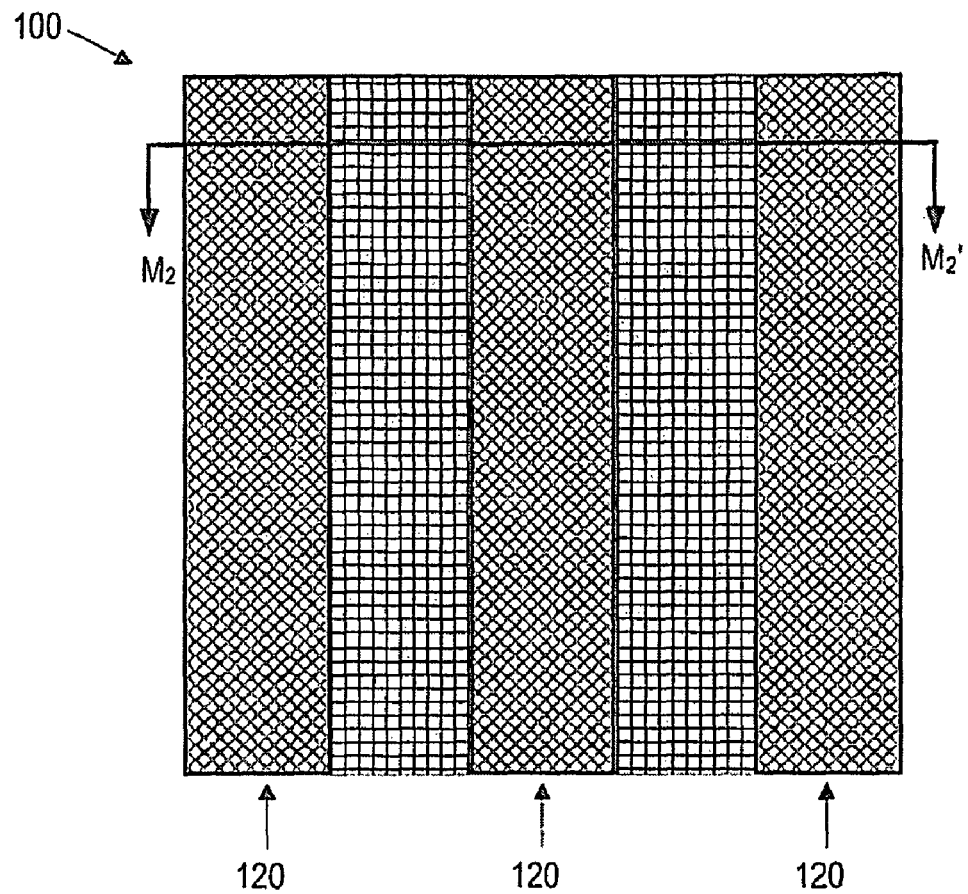
FIGS. 24-25 illustrate a further embodiment for fabricating lower conductor strips according to one embodiment.
Figure 25:
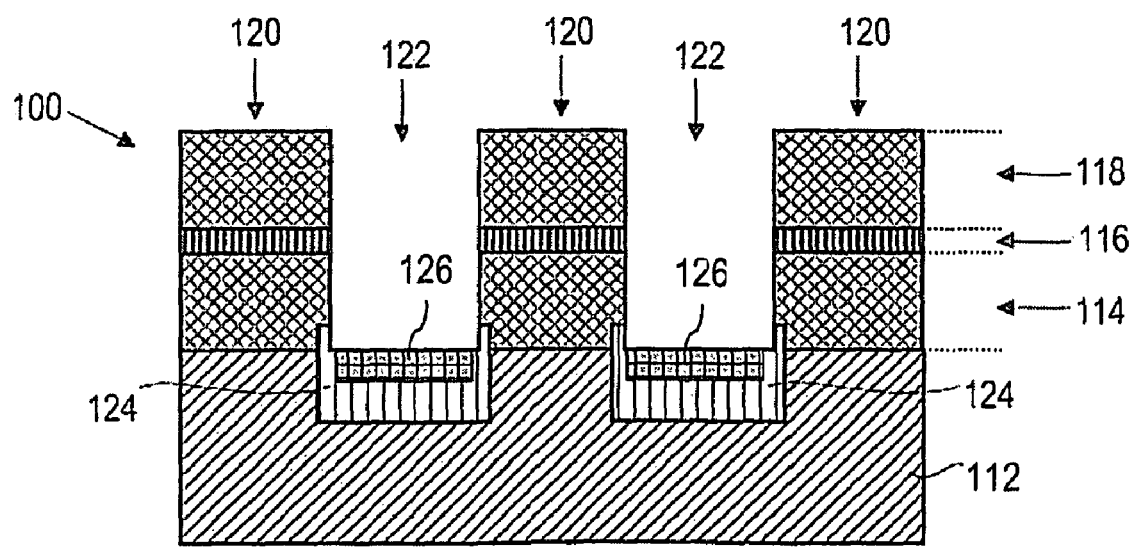

FIGS. 24 and 25 illustrate a further embodiment for fabricating lower conductor strips 124. FIG. 25 is a section view taken along section line $M_2$-$M_2$' as shown in FIG. 24. In the embodiment of FIG. 25, the silicon substrate 112 is first doped to N+ (124) in the channel 122 area. This is followed by doping the channel 122 area to a P-type material (126). In this manner, a diode PN junction is formed in the event it is desirable to have the cross point memory allow conduction in only one direction when a connector is conductive.

Figure 26:
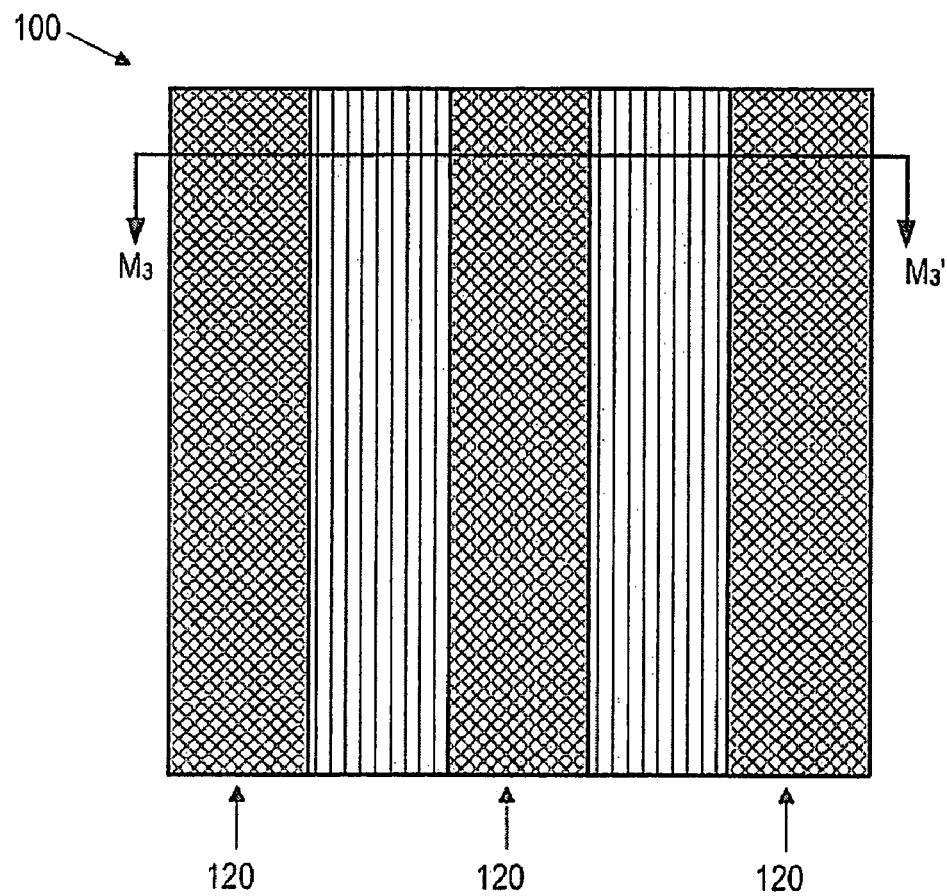
FIGS. 26-27 illustrate yet another embodiment for forming lower conductors.
Figure 27:
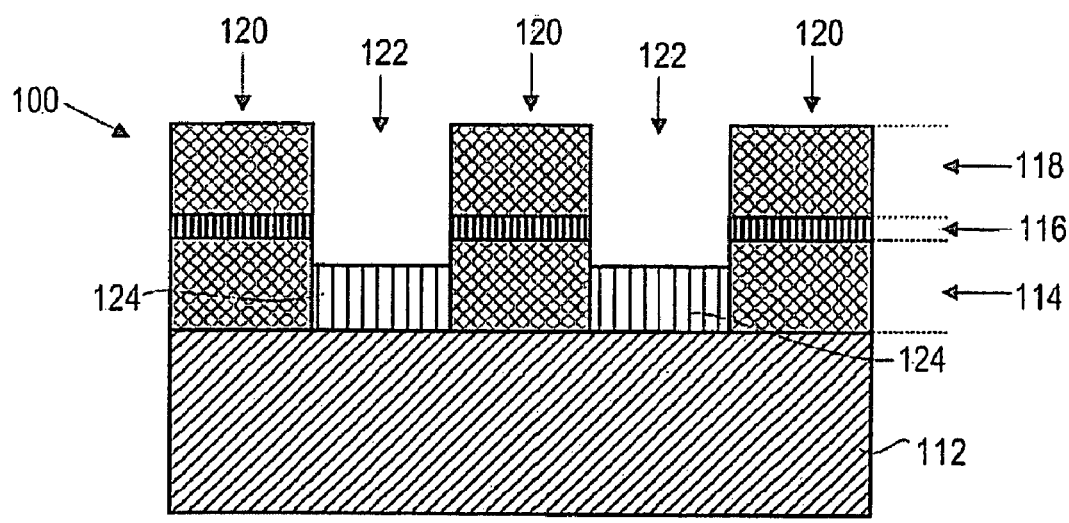

FIGS. 26 and 27 illustrate yet another embodiment for forming lower conductor 124. FIG. 26 is similar to FIG. 24 with a section view taken along line $M_3$-$M_3$'. In this embodiment, a material such as aluminum or tungsten may be deposited within trenches 122 and subsequently subjected to an etching process to form first conducting layer 124 with a height not exceeding the level of etch mask layer 116. FIG. 27 shows that the etch stop is removed in the areas of trench 122.

Figure 28:
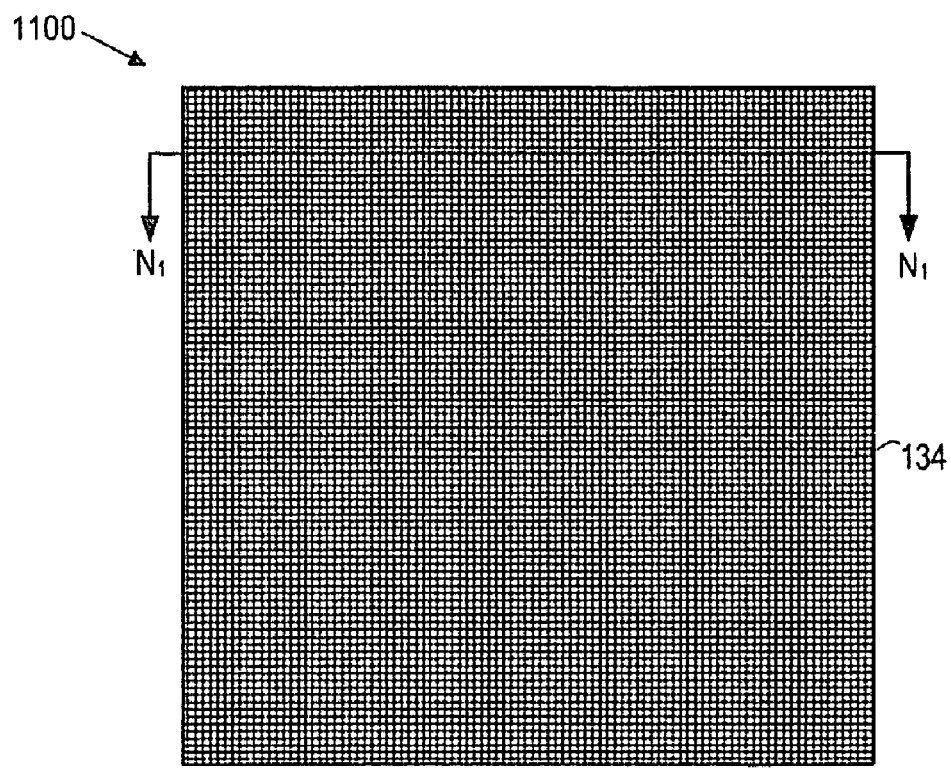
FIGS. 28-29 illustrate views of further processing of the structure according to one embodiment.
Figure 29:
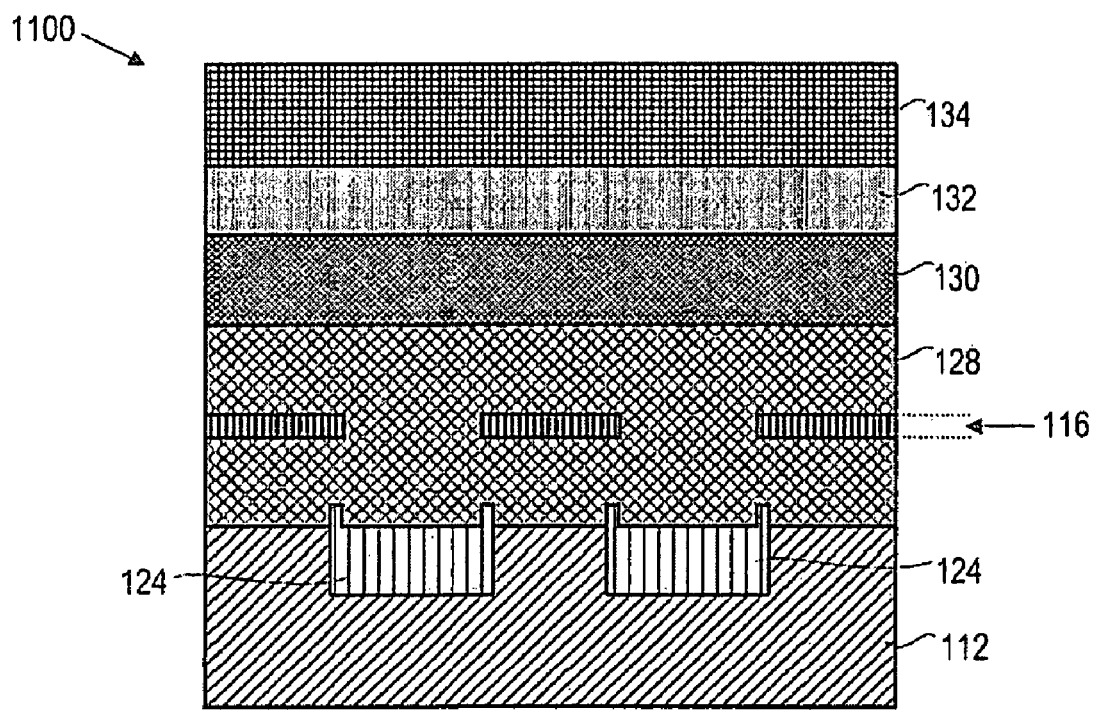

FIGS. 28 and 29 illustrate views of further processing of the structure of FIG. 23 wherein multiple layers are deposited to form a multi-layer structure 1100. FIG. 29 is the top view and FIG. 28 is the section view along line $N_1$-$N_1$'. First, a dielectric material is used to fill the trench 122. More specifically, a dielectric material 128 is deposited within trenches 122 to form a continuous dielectric layer with first dielectric layer 114 and second dielectric layer 118 both shown in FIG. 23. Dielectric layer 128 may comprise substantially the same material as first and second dielectric layers 114 and 118 described above with respect to FIG. 23. In the following, this dielectric layer may be referred to as layers 114 and 118 or simple as a single layer 128. A resist layer 130 is then deposited on dielectric layer 128. Layer 130 may comprise an organic material such as amorphous carbon or a polymeric resist material. A hard mask layer 132 is then deposited on resist layer 130. Hard mask layer 132 may comprise materials including but not limited to spin-on-glass, SiN, and SiC. Another resist layer 134 is then deposited on hard mask layer 132.

FIG. 27 shows the structure 100 once lower conductors are formed as discussed in FIGS. 22B-26. The dielectric material 128 is deposited into the trenches 122 and over the dielectric stack as shown in FIG. 29. At this stage, this dielectric 128 is planarized using a process such as chemical mechanical polishing (CMP). An organic material 130 such as amorphous carbon or a polymeric resist material is deposited onto the dielectric stack comprising dielectric 128 and etch stop 116. Next a hard mask film 132 is deposited on layer 130. Hard mask 132 may be a spin-on-glass (SOG), SiN, SiC, and etc. The hard mask may also comprise dual-top hard mask which includes a thinner hard mask 134 (e.g., SiN) on top of a thicker hard mask 132 (e.g., SOG). The SiN layer 134 may be made thin enough to allow easy pattern transfer from a lithography process such as imprint, photolithography, etc; and the lower SOG is made thick enough to allow pattern transfer at least through the deep amorphous carbon layer 130. A high-resolution lithography such as 193 nm or 193 nm immersion or imprint lithography or EUV may be used to create a pattern on top of the hard mask (or dual-top hard mask).

Organic layer 130, hard mask layer 132, and resist layer 134 may be deposited to form the multi-layered structure 1100 by methods including, but not limited to, chemical vapor deposition (CVD), physical vapor deposition (PVD), sputter deposition, spin-coating and dispensing of a liquid.

Figure 30:
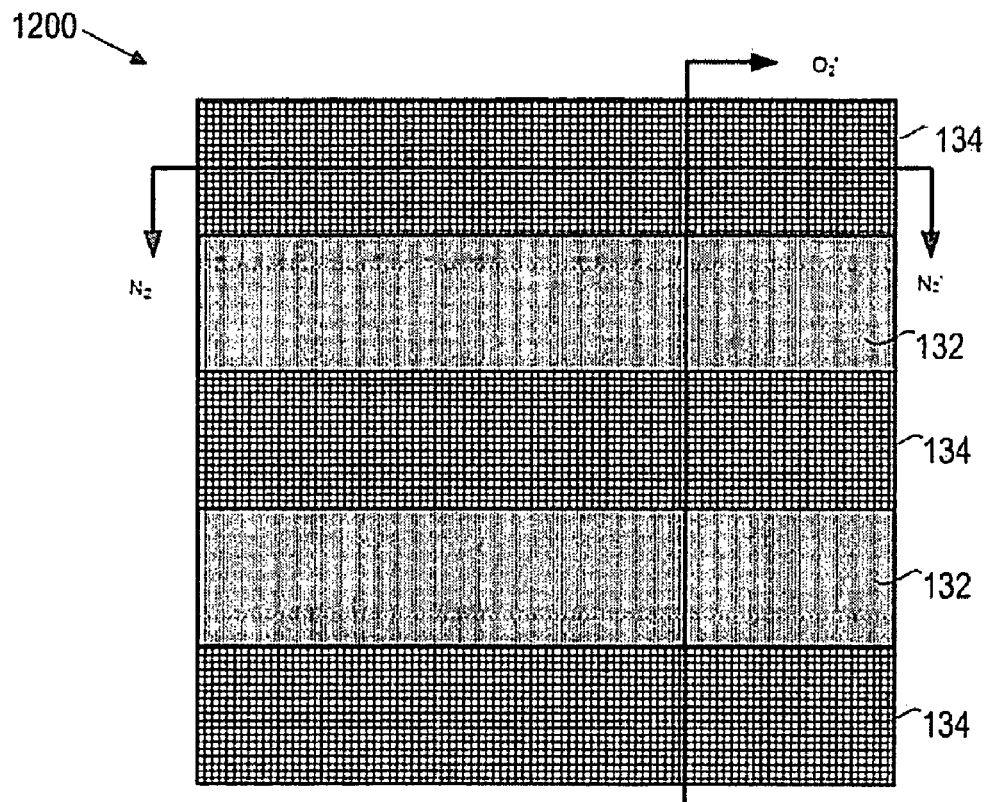
FIGS. 30-32 show a top view and section views of a multi-layered structure according to one embodiment.
Figure 31:
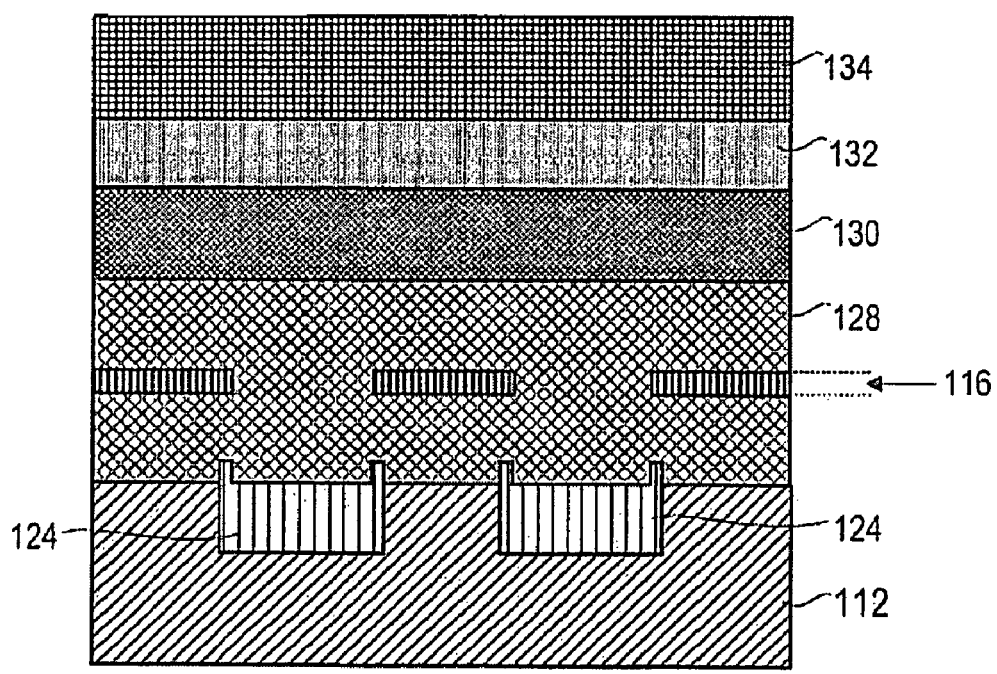
Figure 32:
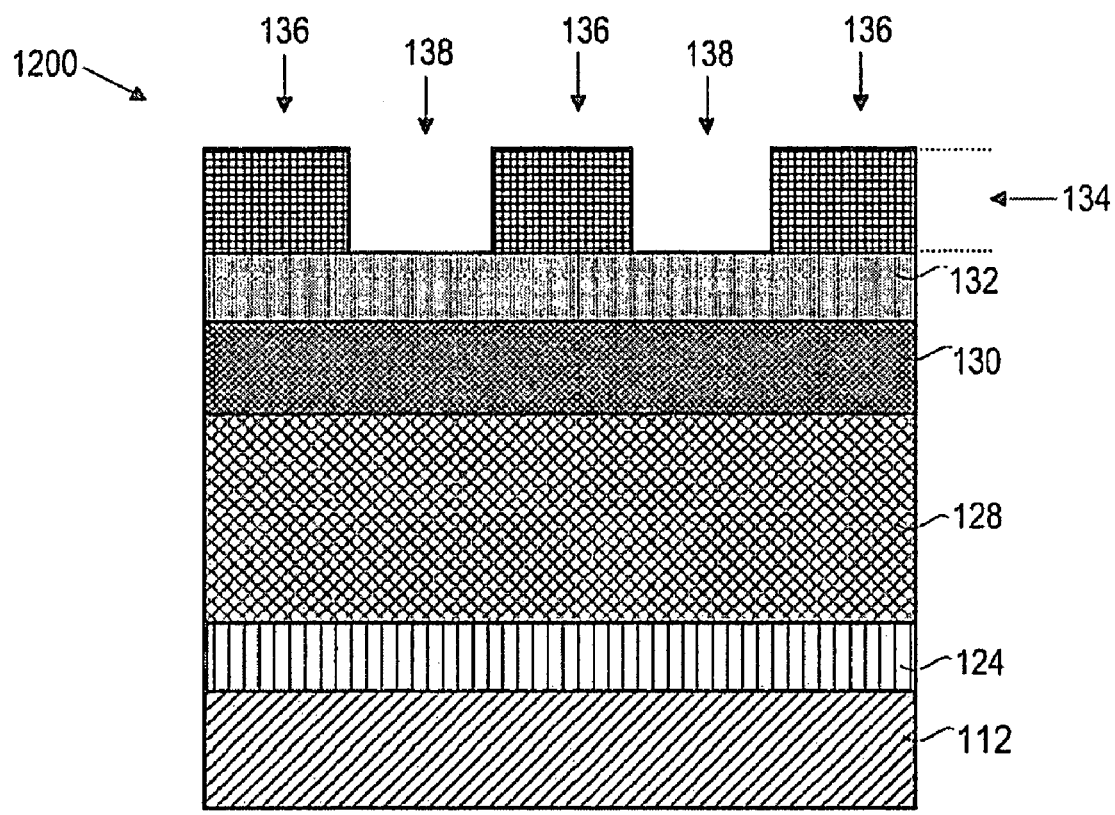

FIGS. 30-32 show a top view and section views of multi-layered structure 1100 after a channel pattern is formed in resist layer 134 orthogonal to channels 122 thereby defining multi-layered structure 1200. FIG. 31 is the view taken along line $N_2$-$N_2$' and FIG. 32 is the section view taken along line $O_2$-$O_2$'. The pattern formed in resist layer 134 define gratings defined by lines 136 and trenches 138. The gratings extend along a direction $V_2$ orthogonal to the direction VI shown in FIG. 22. Trenches 138 may only extend down to hard mask layer 132 after a first etching step. In one embodiment pattern 132 may be formed with an imprint mold where resist 134 is a formable layer. Therefore, the first step would entail removing the resist in the pattern channel 132 and further etching through to hard mask 132. FIG. 32 shows the section view where all of the layers of structure 1200 are visible. The view in FIG. 32 shows resist 134 removed down to hard mask 132.

Figure 33:
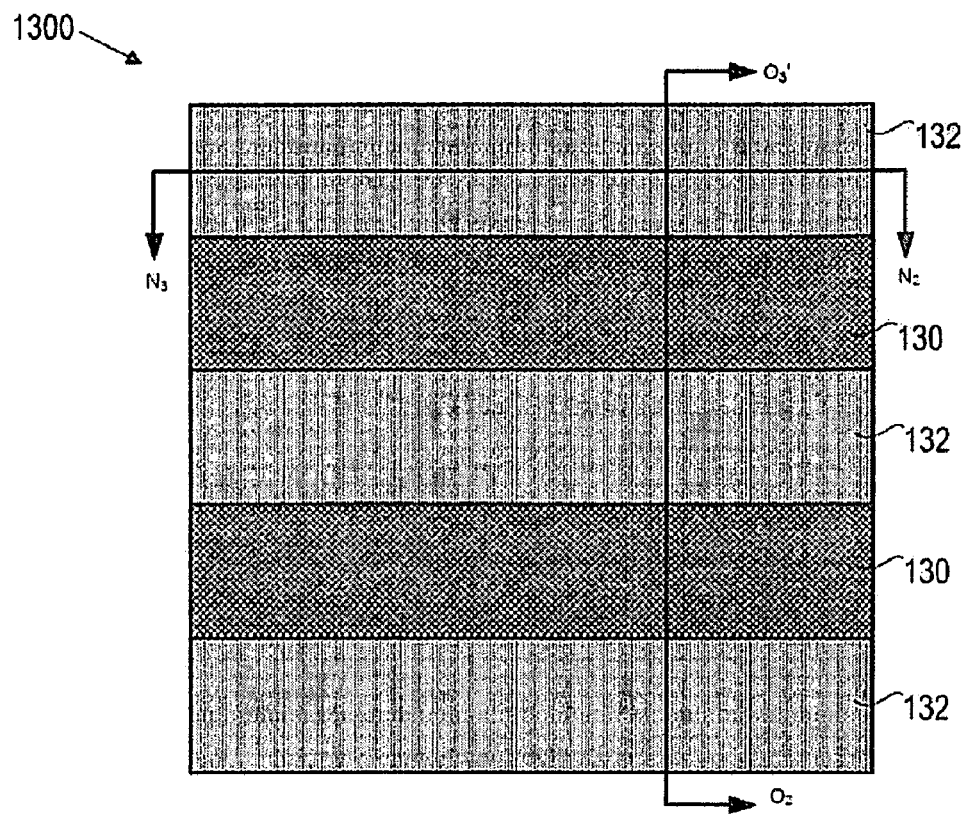
FIGS. 33-35 show various views of a multi-layered structure according to one embodiment after further processing.
Figure 34:
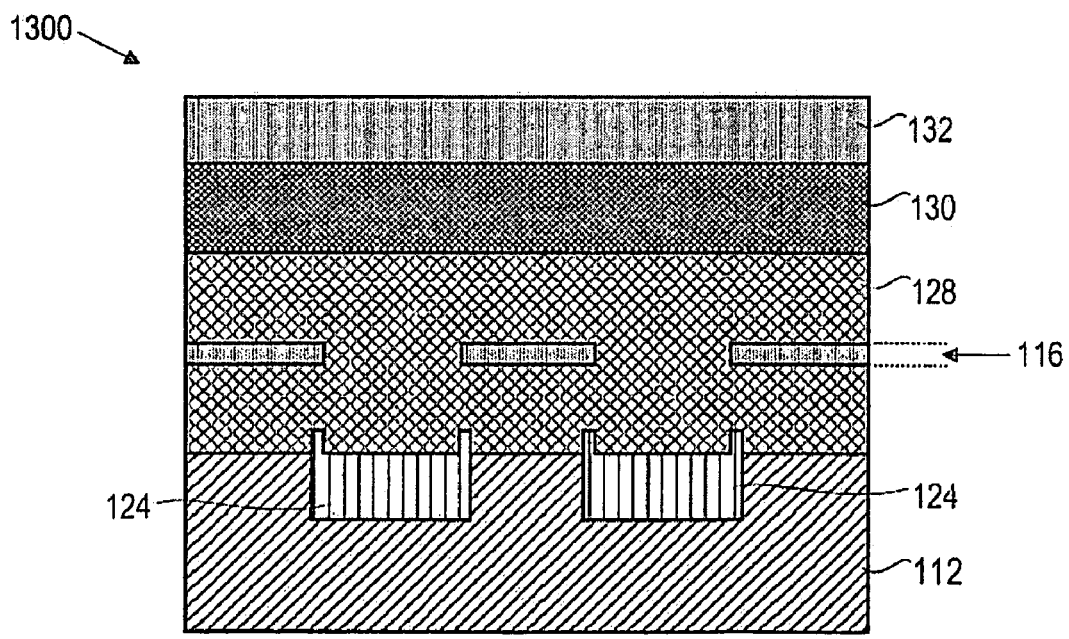
Figure 35:
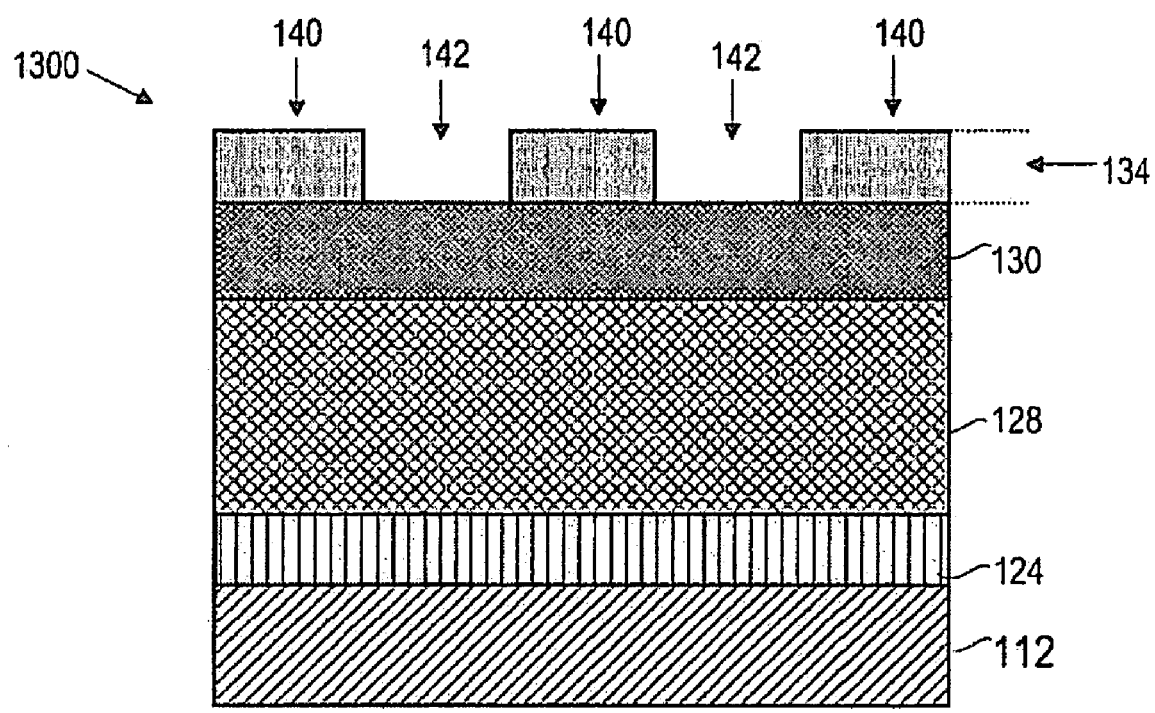

FIGS. 33-35 show various views of multi-layered structure 1200 with resist 134 removed after the pattern of channels 138 are formed in mask layer 132 thereby defining multi-layered structure 1300. FIG. 34 is the section view taken along line $N_3$-$N_3$' and FIG. 35 is the section view taken along line $O_3$-$O_3$'. The pattern formed in resist layer 132 define gratings as lines 140 and trenches 142. Lines 140 extend along direction $V_2$ orthogonal to the direction VI of channels 122 shown in FIG. 22. Trenches 142 may only extend down to organic layer 130 after a second etching step. FIG. 34 shows the view where all of the layers of structure 1300 are visible. The view in FIG. 35 shows resist 134 removed down to organic layer 130.

Figure 36:
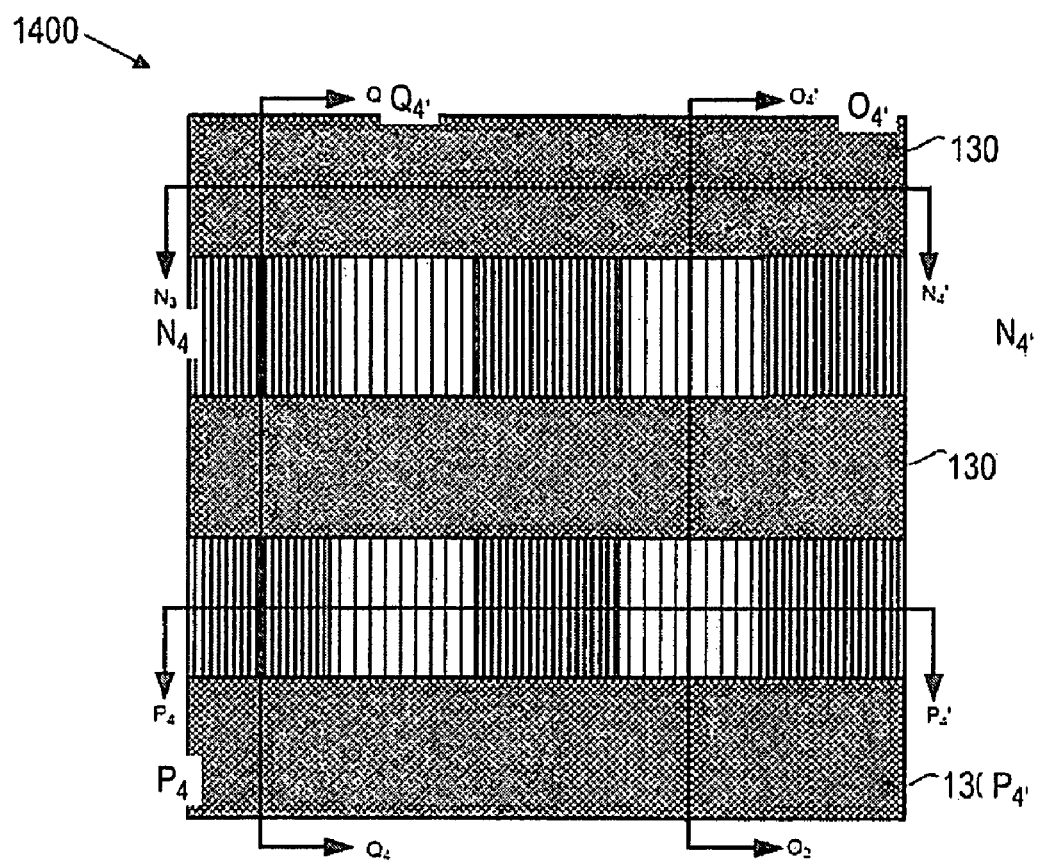
FIGS. 36-40 show various views of a multi-layered structure according to one embodiment after further processing.
Figure 37:
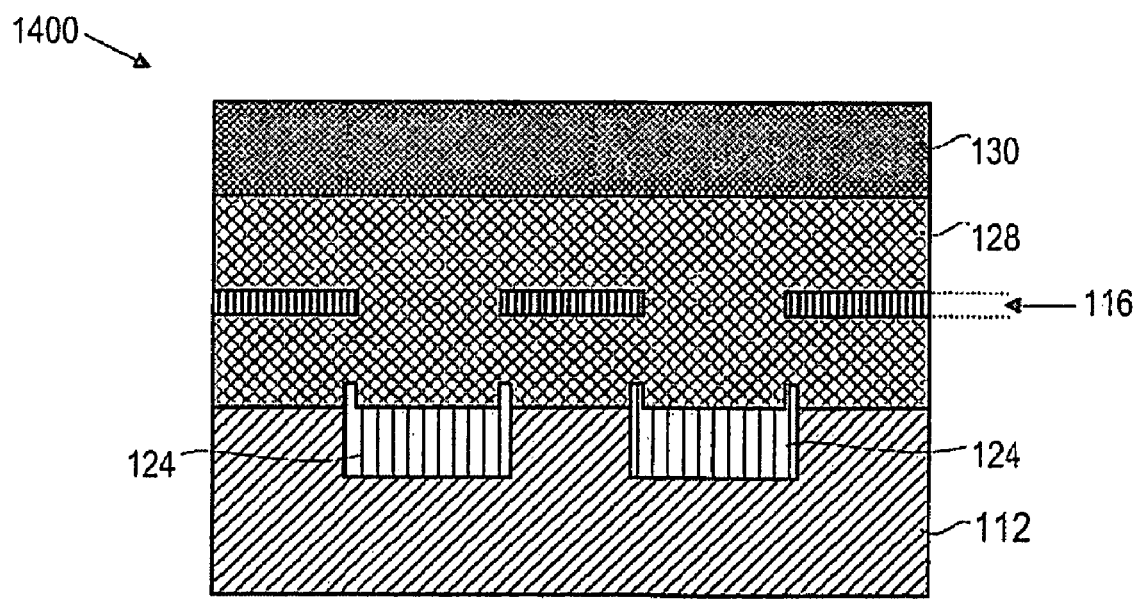
Figure 38:
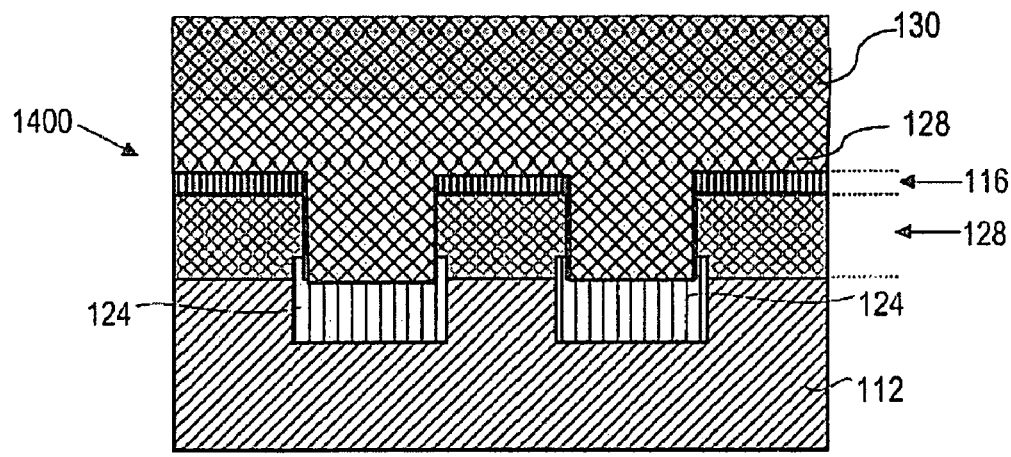
Figure 39:
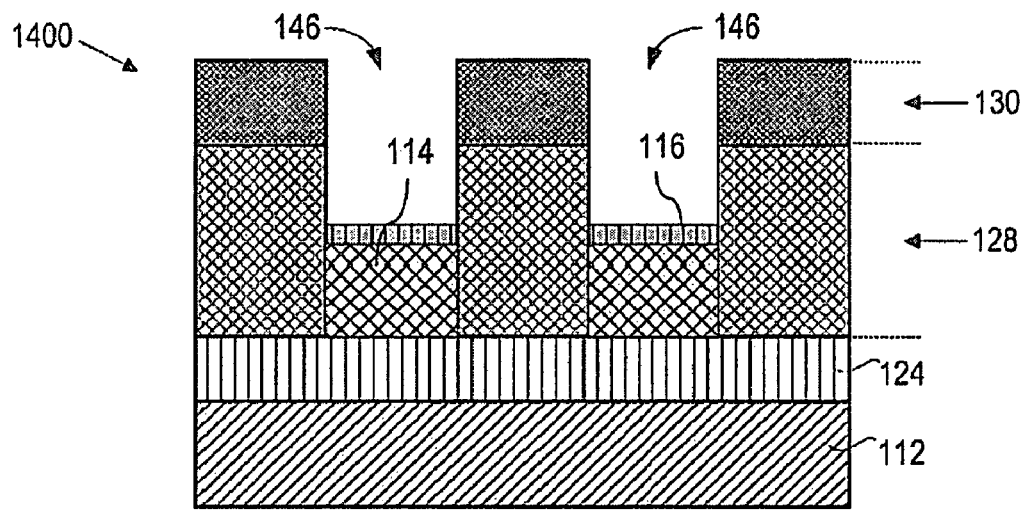
Figure 40:
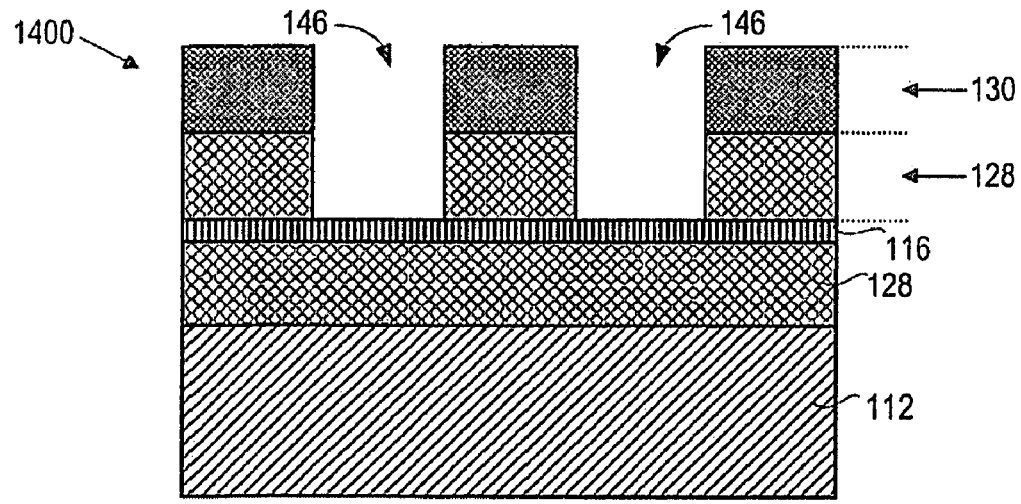

FIGS. 36-40 show various views of multi-layered structure 1300 with resist 132 removed once the pattern of trenches 142 have been etched in multi-layered structure 1300. FIG. 36 is the top view of structure 1300 with resist 130 removed after etching the pattern of trenches 142 through dielectric layers 114 and 128 in areas not blocked by etch stop layer 116 thereby defining multi-layered structure 1400. FIG. 37 is the section view along section line $N_4$-$N_4$' through organic layer 130. Since this view is through the total layered structure, all the layers are visible along with the opening through the layer 116. FIG. 38 is the section view along section line $P_4$-$P_4$' showing the dielectric 128 removed down to the lower conductor 124. However, all the layers are visible behind the via 144 down to lower conductor 124. In this view, via edges differentiate the via 144 itself. FIG. 39 is the section view along line $O_4$-$O_4$' showing lateral trench 146 down to a side view of the lower conductor 124. Trench 146 provides the channel for an upper conductor (not shown). In this view, dielectric layer 114 and mask 116 are shown in the background. FIG. 40 the section view along section line $Q_4$-$Q_4$' through portions of layer 116. FIG. 40 provides another view of trench 146 wherein lower conductor 124 is not visible since it is blocked by dielectric 128.

Figure 41:
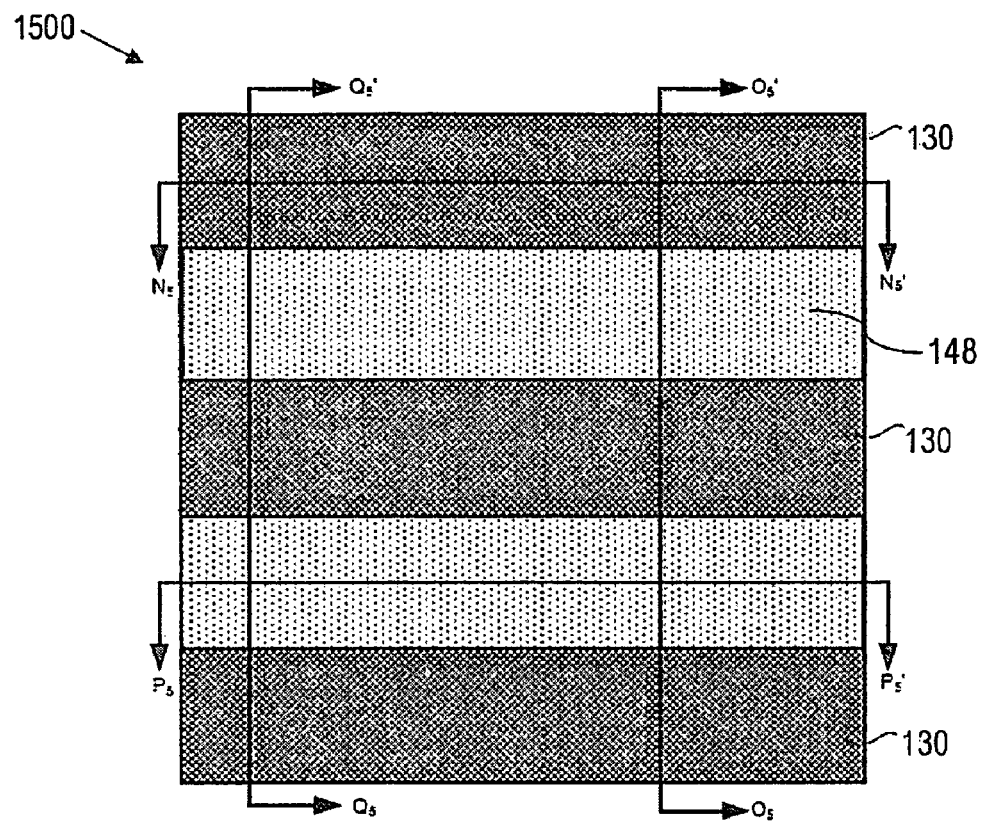
FIGS. 41-45 show various views of a multi-layered structure according to one embodiment after further processing.
Figure 42:
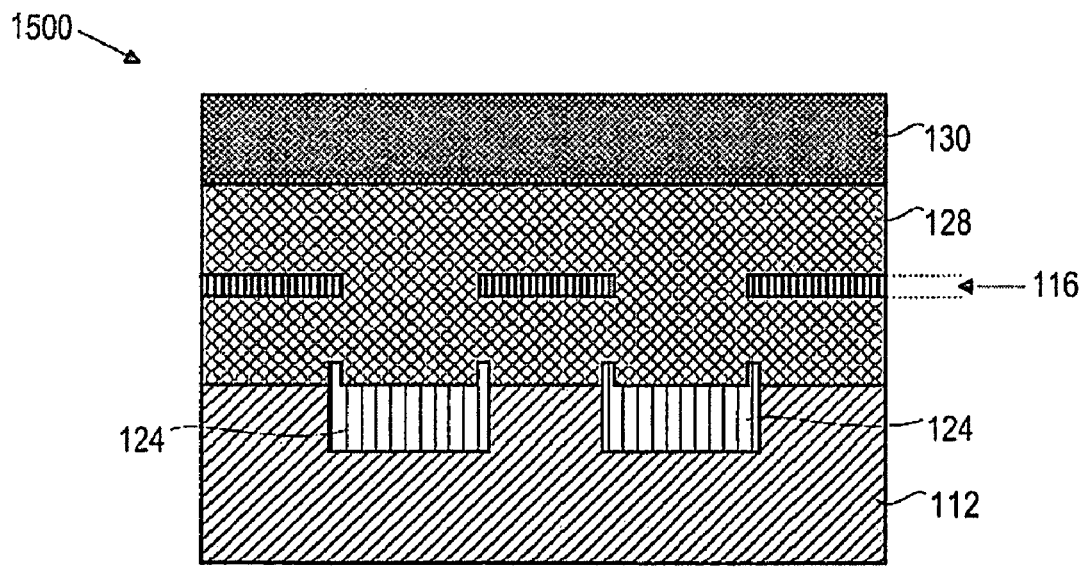
Figure 43:
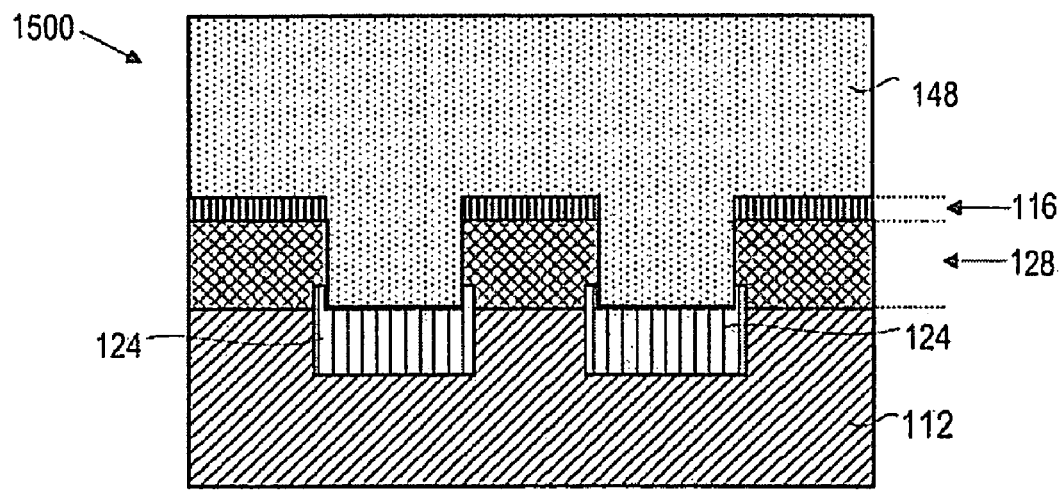
Figure 44:
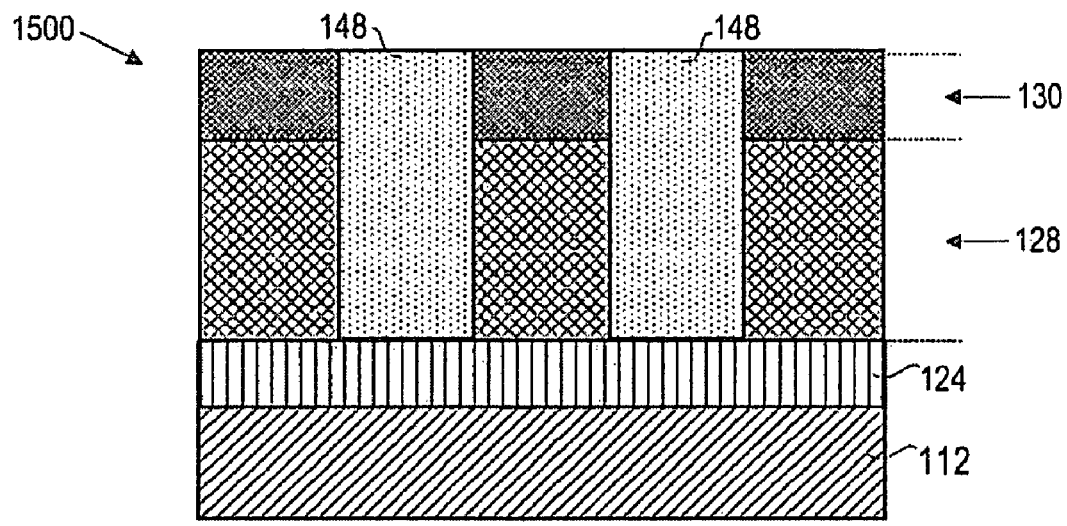
Figure 45:
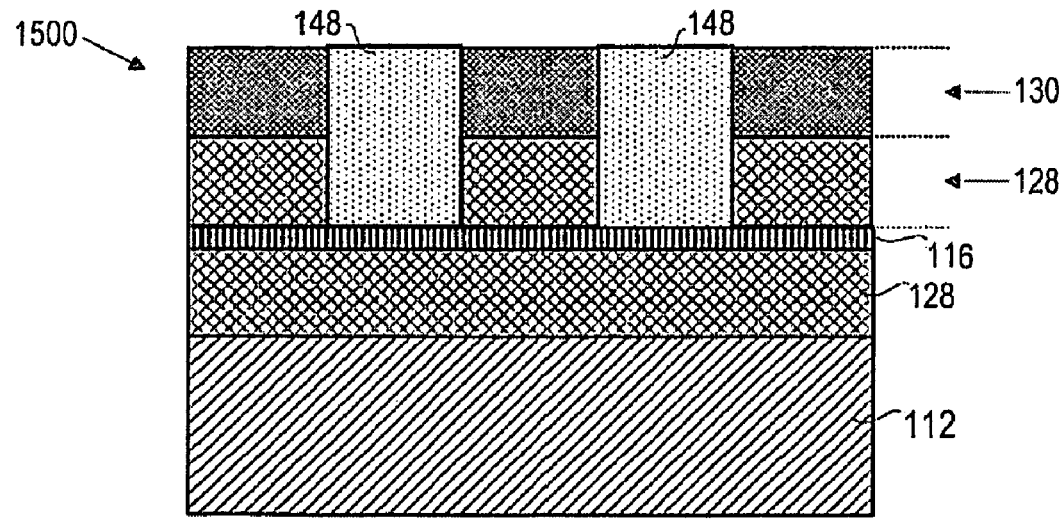

The multi-layered structure 1400 has channels 146 and vias 144 in condition to receive a switching or connector material with characteristics suitable for forming a read/write memory element. The connector material is so called because it provides the switchable connection between an upper conductor (not shown) and lower conductor 124. FIG. 41 is a top view of multi-layered structure 1400 after depositing a connector layer 148 thereby forming the basis for multi-layered structure 1500. In this view, connector material 148 is shown filling channel 146 over exposed portions of layer 116 (see FIG. 36) and through vias 144 down to the lower conductor 124. FIG. 42 is the section view along section line $N_5$-$N_5$' orthogonal to lower conductor 124. Since this view is through the total layered structure, all the remaining layers are visible along with the opening through etch stop 16. FIG. 43 is the section view taken along section line $P_5$-$P_5$' through channel 146 and the just deposited connector material 148. The connector material 148 is shown extending to the surface of the structure and down to lower conductor 124. FIG. 44 is the section view taken along line $O_5$-$O_5$' axially through a lower conductor 124. In this view, the connector material 148 is shown extending to the surface of the structure 1500 and in the via 144 down to lower conductor 124. The section of organic layer 130 and dielectric layer 128 are also visible on each side of the channels 146 with connector material 148. FIG. 45 is the section view taken along section line $Q_5$-$Q_5$' through the layers separating the lower conductor 124 lines. In this view, the via 144 down to conductor 124 is blocked from view by sections of layers 116 and 128. The portion of connector material 148 in channel 146 and extending to the surface of structure 1500 is also visible. Connector layer 148 may be deposited on multi-layered structure 1400 by processes including, but not limited to, chemical vapor deposition (CVD), physical vapor deposition (PVD), sputter deposition, spin-coating and dispensing of a liquid.

Figure 46:
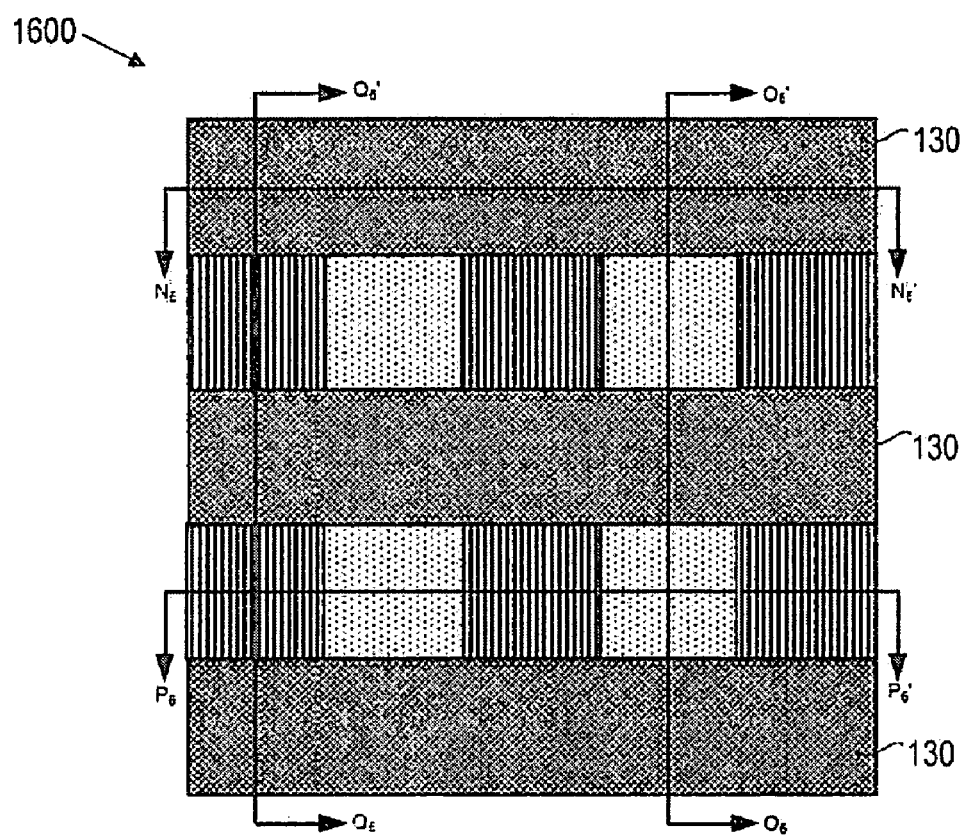
FIGS. 46-50 show various views of a multi-layered structure according to one embodiment after further processing.
Figure 47:
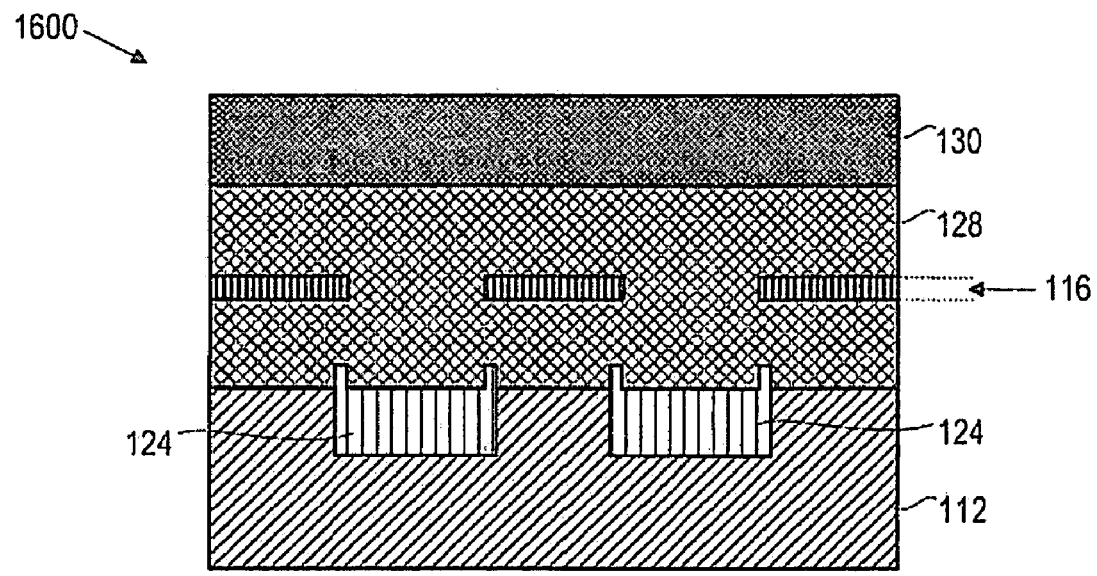
Figure 48:
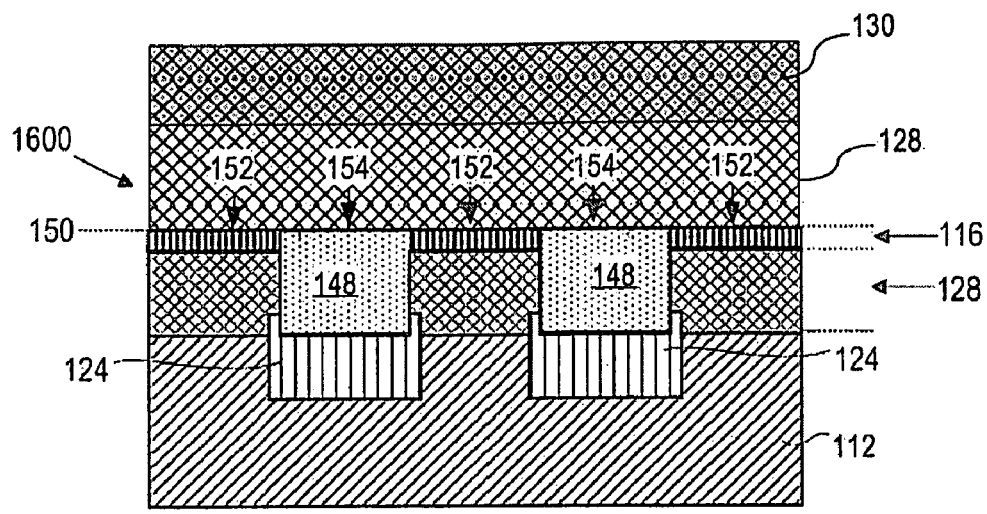
Figure 49:
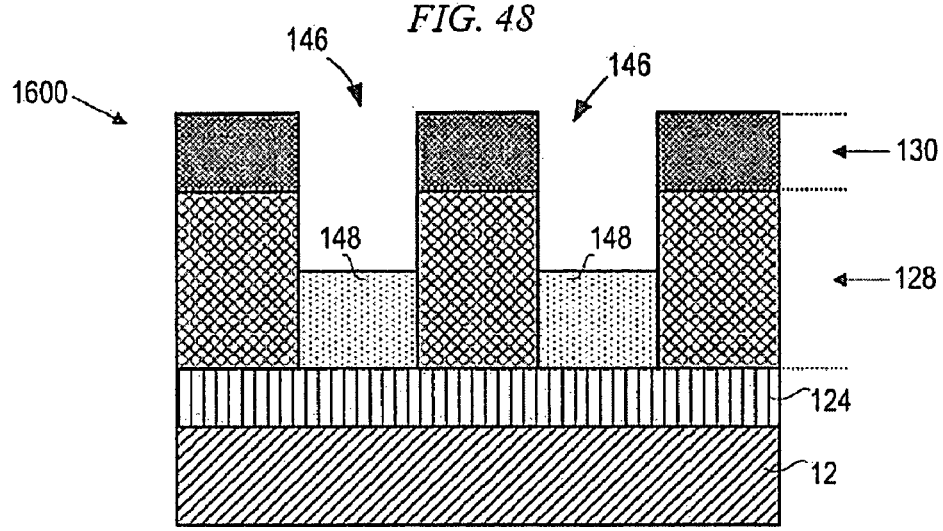
Figure 50:
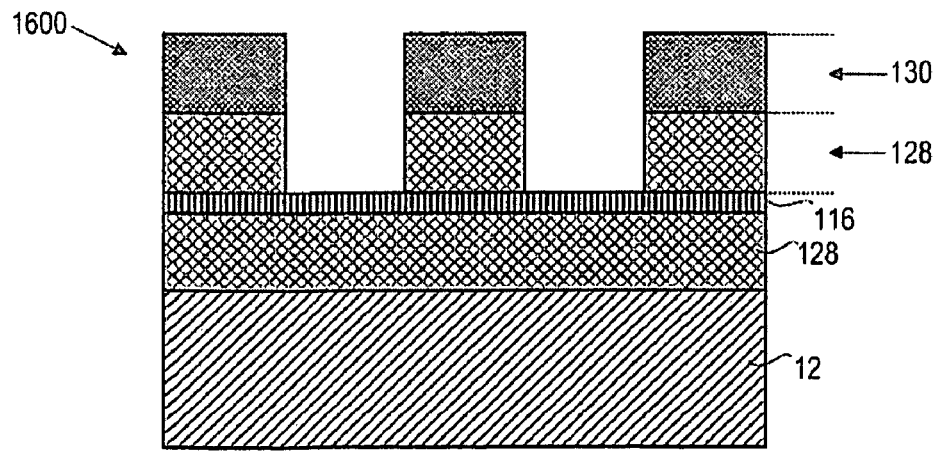

FIG. 46 is a top view of multi-layered structure 1500 after being subjected to an etching chemistry to remove portions of connector layer 148 thereby defining multi-layered structure 1600. In this view, the connector material 148 has been etched away in all places except in the vias 144 to lower conductor 124. FIG. 47 is the section view along section line $N_6$-$N_6$' orthogonal to lower conductor 124. Since this view is through the total layered structure, all the remaining layers are visible along with the opening through the etch stop layer 116 and shows the same layers as FIG. 42. FIG. 48 is the section view along section line $P_6$-$P_6$' showing the dielectric connector material 148 filling the via 144 down to lower conductor 124. In this view, all the layers are visible behind the via 144 down to lower conductor 124 and the via edges differentiate the filled via 144 itself. FIG. 49 is the view taken along line $O_6$-$O_6$'. In this view, the connector material 148 fills the via to the surface of etch stop layer 116. The layers of dielectric 128 and layer 130 separating channels 146 are also visible in this view. FIG. 50 is the section view taken along section line $Q_6$-$Q_6$' through the layers separating the lower conductor 124 lines. In this view, sections of layer 116 and 128 block the view of connector material 148 that fills the via 144 down to lower conductor 124. Portions of connector layer 148 may be removed such that a crown surface 150 is formed as shown in FIG. 48. The crown surface 150 in FIG. 48 is defined by an exposed surface 152 of etch stop layer 116 and upper surface 154 of connector material 148.

Figure 51:
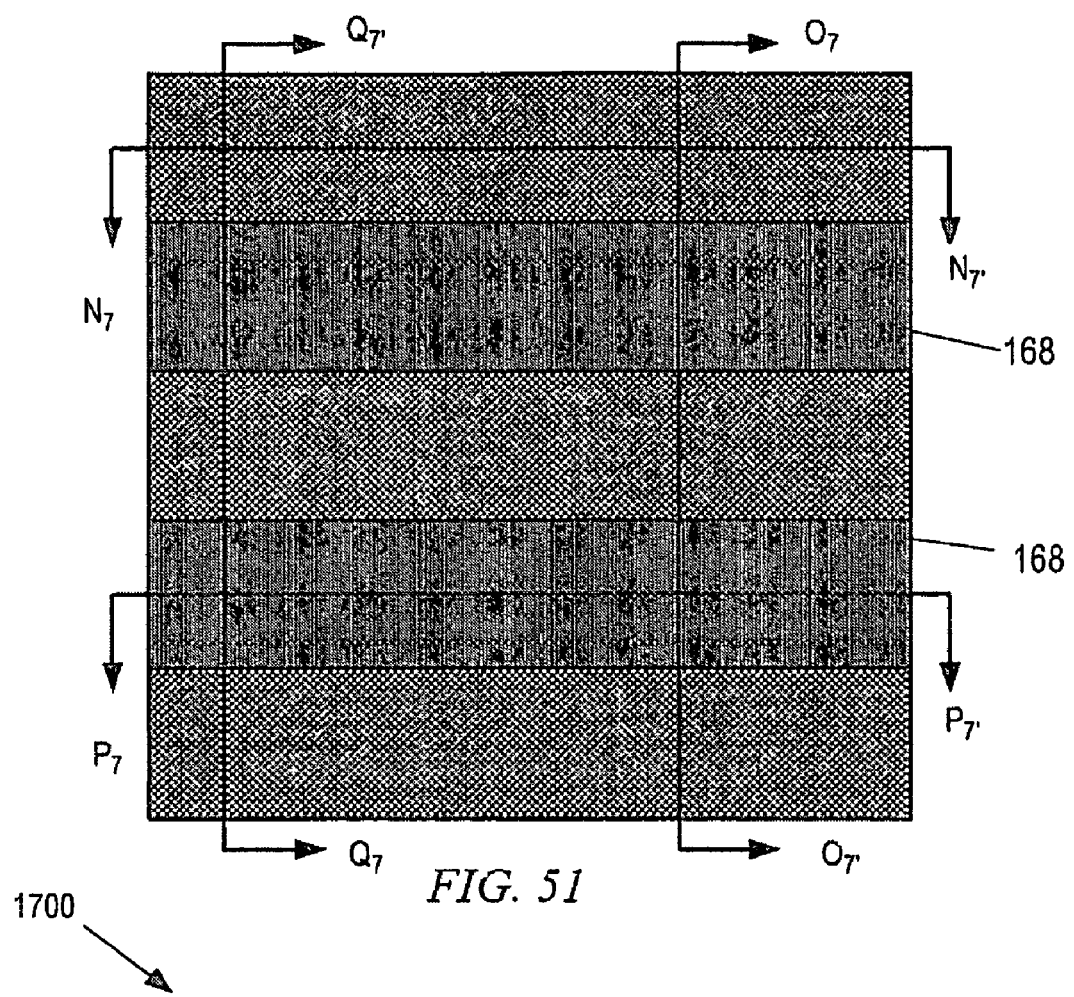
FIGS. 51-55 show various views of a multi-layered structure according to one embodiment after further processing.
Figure 52:
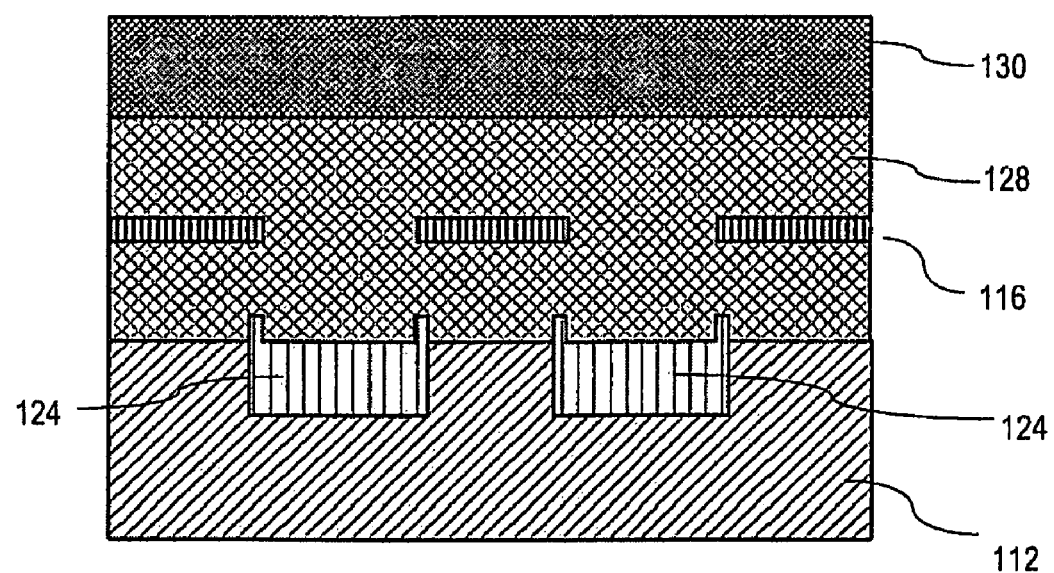
Figure 53:
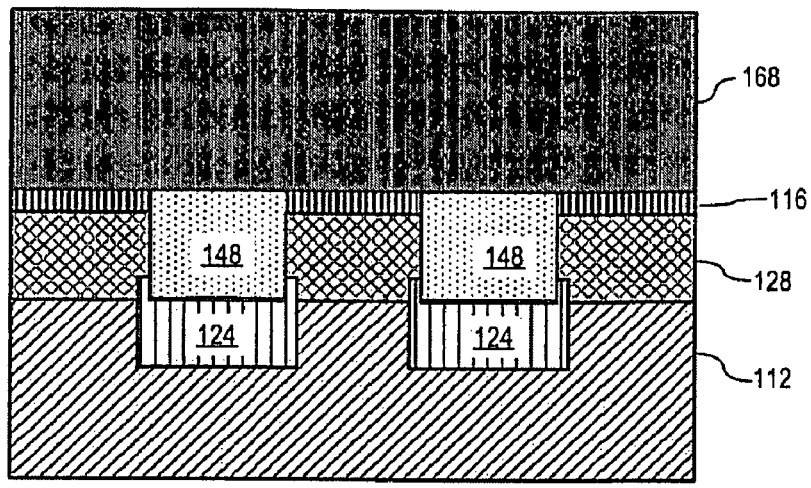
Figure 54:
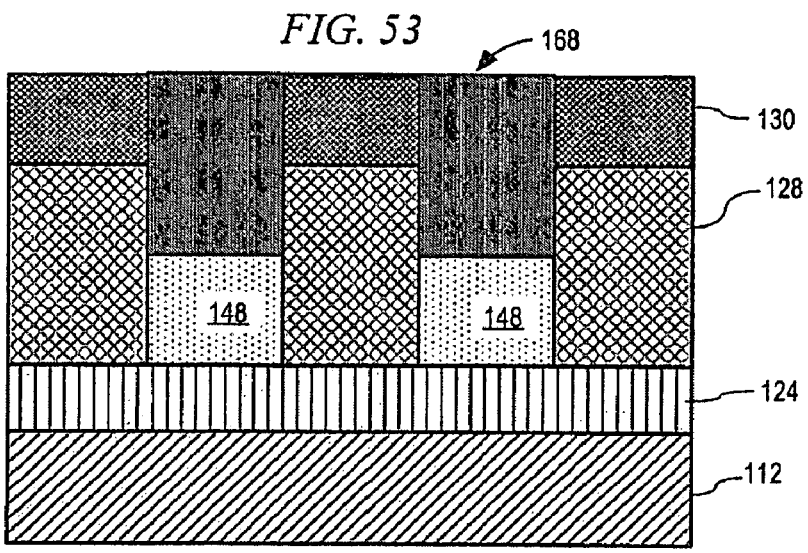
Figure 55:
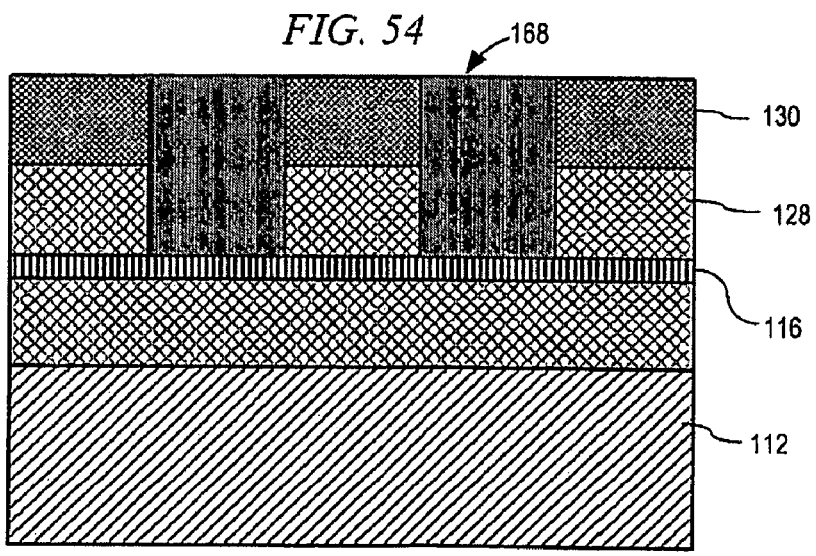

FIG. 51 is a top view of multi-layered structure 1600 after a upper conductor 168 is deposited in channel 146 orthogonal to lower conductor 124 defining multi-layered structure 1700. In this view, the upper conductor 168 fills channel 146 substantially to the surface of organic layer 130. FIG. 52 is the section view along section line $N_7$-$N_7$' through the layers separating channels 146. FIG. 53 is the section view taken along section line $P_7$-$P_7$' through the upper conductor 168. In this view, upper conductor 168 blocks from view the layers separating channels 146. FIG. 54 is the view taken along line $O_7$-$O_7$' through a lower conductor 124. In this view, the upper conductor is visible from the connector material 148 to the top of organic layer 130. FIG. 55 is the section view taken along section line $Q_7$-$Q_7$' through lower the section of layers separating the lower conductors 124. In this view, the portion of the upper conductor 168 extending to the top of layer 130 in channels 146 is visible. Lower conductor 124 and the connector material 148 are blocked from view. The upper or second conducting layer 168 may comprise copper and may be deposited on multi-layered structure 1700 by methods including, but not limited to, electroplating.

Figure 56:
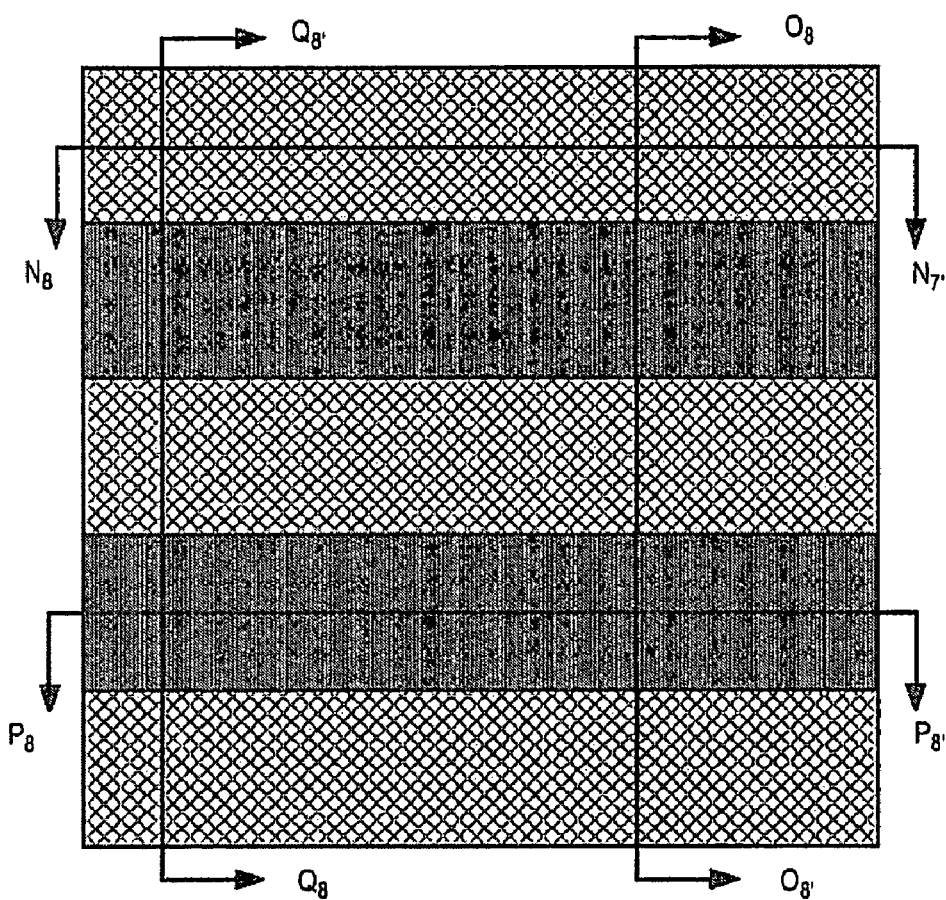
FIGS. 56-60 show various views of a multi-layered structure according to one embodiment after further processing.
Figure 57:
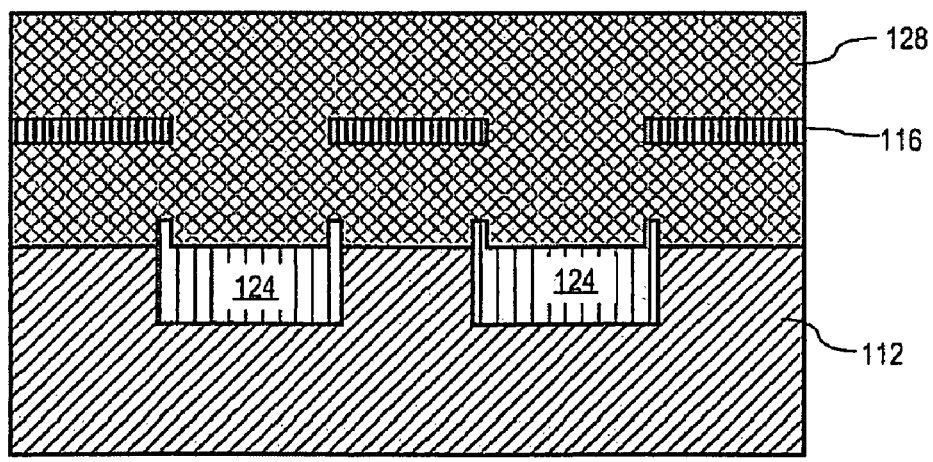
Figure 58:
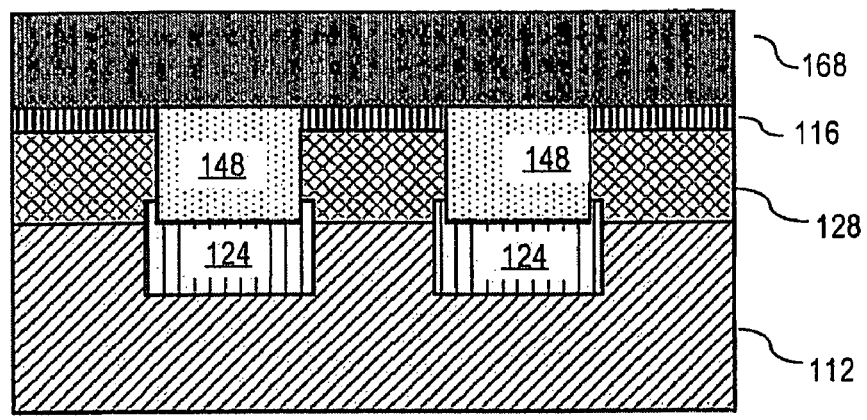
Figure 59:
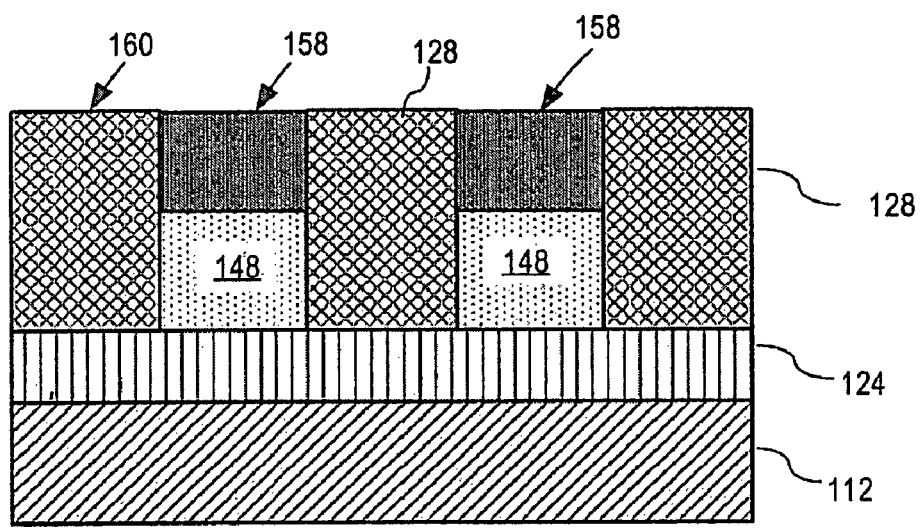
Figure 60:
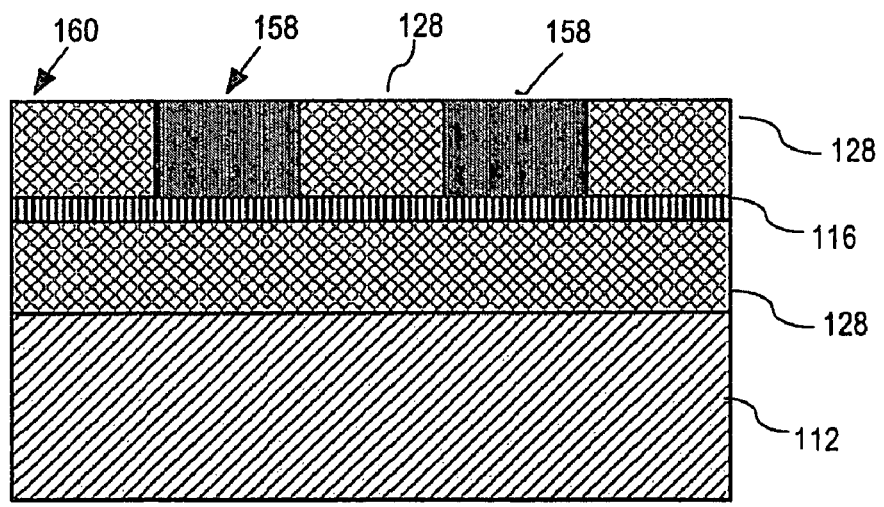

FIG. 56 is a top view of multi-layered structure 1700 after being polished with a CMP process to remove organic layer 130 and portions of conductor layer 168 thereby defining multi-layered structure 1800. FIG. 57 is the section view along section line $N_8$-$N_8'$ through the layer section separating channels 146. FIG. 58 is the section view taken along section line $P_8$-$P_8'$ through the upper conductor 168. In this view, upper conductor 168 blocks from view the layers separating channels 146. FIG. 59 is the section view taken along section line $Q_8$-$Q_8'$ through a lower conductor 124. FIG. 60 is the section view taken along section $Q_8$-$Q_8'$ through lower the section of layers separating the lower conductors 124. In this view, the portion of the upper conductor extending to the top of layer 128 in channels 146 is visible. Lower conductor 124 and the connector material 148 are blocked from view. Portions of second conducting layer 168 and organic layer 130 may be removed such that a crown surface 158 may be defined, as shown in FIGS. 59 and 60. Crown surface 158 is defined by an exposed surface 160 of dielectric layer 128 and upper surface 162 of second conducting layer 148.

The disclosed method essentially creates connectors 148 between the top and the bottom conductors (168 and 124, respectively) wherever they intersect when overlaid orthogonally. Therefore, if there are regions of the two conductor levels that need to be isolated from one another, for e.g. regions where the conductor levels are connected to other parts of the memory circuitry, these regions may need to be handled differently. For example, the lower conductors may not extend beyond the cross-point area in one directional axis (e.g., X-axis) and the upper conductors may not extend in another orthogonal axis (e.g., Y-axis). In this manner, the two conductor levels may be isolated for further processing.

The embodiments of the present invention described above are exemplary. Many changes and modifications may be made to the disclosure recited above, while remaining within the scope of the invention. Therefore, the scope of the invention should not be limited by the above description, but instead should be determined with reference to appended claims along with their full scope of equivalents.

What is claimed is:

1. A process for fabricating a cross-point memory element for a memory array comprising: applying a first lithography step to a composite multilayer structure that includes a substrate, a dielectric multilayer, and a first resist material layer whereby a pattern for a plurality of first channels is formed in the first resist material layer and in the dielectric multilayer; applying a first sequence of etching and deposition steps to form a plurality of first conductors on an area of the substrate within the first channels; applying a sequence of deposition steps to fill the plurality of first channels with a dielectric material on the first conductor and form a second resist material layer on the dielectric material thereby forming a modified composite multilayer structure; applying a second lithography step to the modified composite multilayer structure whereby a pattern for a plurality of second channels, disposed over and orthogonal to the plurality of first channels, is formed in the second resist material; applying a second sequence of etching and deposition steps to form the plurality of second channels and a plurality of connectors that make electrical contact with segments of the plurality of first conductors exposed in the second channels; and applying a third sequence of etching and deposition steps to form a plurality of second conductors that contact the connectors within the plurality of second channels wherein the second resist material layer is a composite of multiple resist layers comprising: a first layer of organic resist material disposed over the dielectric material filling the plurality of first channels; a second layer of hard mask material disposed over the first layer of organic resist material; and a third layer of resist material disposed over the second layer of hard mask material.

2. The process of claim 1, wherein the second lithography step forms the pattern of the second channels in the third layer of resist material disposed over the second layer of hard mask material.

3. The process of claim 2, wherein the second sequence of etching and deposition steps comprises:
a first etch step etching the pattern of the second channels through the third layer of resist material;
a second etch step etching the pattern of the second channels through the second resist material layer;
a third etch step etching away remaining third layer of resist material;
a fourth etch step etching the pattern of the second channels through the first resist material layer;
a fifth etch step etching through the dielectric material, in the second channel, through to the first conductor in areas where an etch stop layer is removed and stopping at etch stop material in areas where the etch stop layer remains, wherein portions of the first resist material layer not patterned remain on the surface of the dielectric material layer;
depositing connector material in the plurality of second channels; and
a sixth step etching away any residual connector material that resides on the first resist material layer and excess connector material in the plurality of second channels thus isolating the connector material that extends through the etch stop layer to the first conductor.

4. A process for fabricating a cross-point memory element for a memory array, comprising: applying a first lithography step to a composite multilayer structure that includes a substrate, a dielectric multilayer, and a first resist material layer whereby a pattern for a plurality of first channels is formed in the first resist material layer and in the dielectric multilayer; applying a first sequence of etching and deposition steps to form a plurality of first conductors on an area of the substrate within the first channels; applying a sequence of deposition steps to fill the plurality of first channels with a dielectric material on the first conductor, a polishing step removing any of the conducting material that extends above the dielectric material; and forming a second resist material layer on the dielectric material thereby forming a modified composite multilayer structure; applying a second lithography step to the modified composite multilayer structure whereby a pattern for a plurality of second channels, disposed over and orthogonal to the plurality of first channels, is formed in the second resist material; applying a second sequence of etching and deposition steps to form the plurality of second channels and a plurality of connectors that make electrical contact with segments of the plurality of first conductors exposed in the second channels; and, applying a third sequence of etching and deposition steps to form a plurality of second conductors that contact the connectors within the plurality of second channels wherein the third sequence of etching and deposition steps comprises: depositing a layer of conducting material to fill the plurality of second channels substantially to a surface of the first resist material layer; and an etching step removing the first resist material.

5. A process for fabricating a cross-point memory element for a memory array comprising: applying a first lithography step to a composite multilayer structure that includes a substrate, a dielectric multilayer, and a first resist material layer whereby a pattern for a plurality of first channels is formed in the first resist material layer and in the dielectric multilayer; applying a first sequence of etching and deposition steps to form a plurality of first conductors on an area of the substrate within the first channels; applying a sequence of deposition steps to fill the plurality of first channels with a dielectric material on the first conductor and form a second resist material layer on the dielectric material thereby forming a modified composite multilayer structure; applying a second lithography step to the modified composite multilayer structure whereby a pattern for a plurality of second channels, disposed over and orthogonal to the plurality of first channels, is formed in the second resist material; applying a second sequence of etching and deposition steps to form the plurality of second channels and a plurality of connectors that make electrical contact with segments of the plurality of first conductors exposed in the second channels; and applying a third sequence of etching and deposition steps to form a plurality of second conductors that contact the connectors within the plurality of second channels, wherein the composite multilayer structure comprises: a substrate; a first dielectric layer disposed on the substrate; an etch stop layer disposed on the first dielectric layer; a second dielectric layer disposed on the etch stop layer; and the first resist material layer disposed on the second dielectric layer, and wherein the modified composite multilayer structure comprises: the substrate; a plurality of first conductors formed on the substrate; a connector material over each of the plurality of first conductors; the first dielectric layer deposited in the plurality of first channels; a second layer of conducting material deposited over a surface of the first dielectric material and a surface of the connector material; and the second resist material layer, and wherein the second sequence of etching and deposition steps comprises: a first etch step etching the pattern of the second channels through the second resist material layer; and a second etch step etching the pattern of the second channels through the second layer of conductor material; and a deposition step depositing dielectric in the plurality of second channels thereby isolating the plurality of second conductors.

6. A process for fabricating a cross-point memory element for a memory array comprising: applying a first lithography step to a composite multilayer structure that includes a substrate, a dielectric multilayer, and a first resist material layer whereby a pattern for a plurality of first channels is formed in the first resist material layer and in the dielectric multilayer; applying a first sequence of etching and deposition steps to form a plurality of first conductors on an area of the substrate within the first channels; applying a sequence of deposition steps to fill the plurality of first channels with a dielectric material on the first conductors and form a second resist material layer on the dielectric material thereby forming a modified composite multilayer structure; applying a second lithography step to the modified composite multilayer structure whereby a pattern for a plurality of second channels, disposed over and orthogonal to the plurality of first channels, is formed in the second resist material; applying a second sequence of etching and deposition steps to form the plurality of second channels and a plurality of connectors that make electrical contact with segments of the plurality of first conductors exposed in the second channels; and applying a third sequence of etching and deposition steps to form a plurality of second conductors that contact the connectors within the plurality of second channels, wherein the composite multilayer structure comprises: a substrate; a first dielectric layer disposed on the substrate; an etch stop layer disposed on the first dielectric layer; a second dielectric layer disposed on the etch stop layer; and the first resist material layer disposed on the second dielectric layer, and wherein the modified composite multilayer structure comprises: the substrate; a plurality of first conductors formed on the substrate; a connector material over each of the plurality of first conductors; the first dielectric layer deposited in the plurality of first channels; a second layer of conducting material deposited over a surface of the first dielectric material and a surface of the connector material; and the second resist material layer, and wherein the third sequence of etching and deposition steps comprises: a deposition step depositing a material to fill the plurality of second channels substantially to a surface of the second layer of conductor material; and an etching step removing any residual dielectric material on the second layer of conductor material.

7. The process of claim 6 further comprising a polishing step planarizing a surface of the plurality of second conductors and the dielectric material isolating the plurality of second conductors.

* * * * *